(12) United States Patent
Zhao et al.

(10) Patent No.: US 10,008,439 B2
(45) Date of Patent: Jun. 26, 2018

(54) THIN RECON INTERPOSER PACKAGE WITHOUT TSV FOR FINE INPUT/OUTPUT PITCH FAN-OUT

(71) Applicant: Avago Technologies General IP (Singapore) Pte. Ltd., Singapore (SG)

(72) Inventors: Sam Ziqun Zhao, Irvine, CA (US); Sam Komarapalayam Karikalan, Irvine, CA (US); Edward Law, Ladera Ranch, CA (US); Rezaur Rahman Khan, Irvine, CA (US); Pieter Vorenkamp, Laguna Niguel, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days. days.

(21) Appl. No.: 15/205,991

(22) Filed: Jul. 8, 2016

(65) Prior Publication Data
US 2017/0011993 A1   Jan. 12, 2017

Related U.S. Application Data

(60) Provisional application No. 62/190,687, filed on Jul. 9, 2015.

(51) Int. Cl.
*H01L 23/498* (2006.01)
*H01L 23/31* (2006.01)
(Continued)

(52) U.S. Cl.
CPC .... *H01L 23/49838* (2013.01); *H01L 21/4853* (2013.01); *H01L 21/4857* (2013.01); *H01L 21/565* (2013.01); *H01L 23/3114* (2013.01); *H01L 23/49811* (2013.01); *H01L 23/49822* (2013.01); *H01L 25/0655* (2013.01); *H01L 25/50* (2013.01); *H01L 2224/16225* (2013.01); *H01L 2924/15174* (2013.01);
(Continued)

(58) Field of Classification Search
CPC ...................... H01L 23/49838; H01L 1/48532
See application file for complete search history.

(56) References Cited

U.S. PATENT DOCUMENTS

2015/0097277 A1* 4/2015 Chen .................. H01L 23/3135
257/668

* cited by examiner

*Primary Examiner* — Elias M Ullah
(74) *Attorney, Agent, or Firm* — Sterne, Kessler, Goldstein & Fox P.L.L.C.

(57) ABSTRACT

Semiconductor devices and manufacturing methods are provided for using a Recon interposer that provides a high density interface between the active semiconductor die and the semiconductor substrate and also provides the pitch fan-out. For example, a circuit assembly includes a silicon pad layer including a plurality of metal pads, each metal pad configured to receive a corresponding bump of a plurality of bumps. The circuit assembly further includes an oxide layer disposed on the silicon pad layer and an interposer dielectric layer disposed on the oxide layer. The interposer dielectric layer includes a plurality of routing traces that connect a top surface of the redistribution layer to a bottom surface of the interposer dielectric layer. The circuit assembly further includes an integrated circuit (IC) die attached to the plurality of routing traces at the top surface of the interposer dielectric layer using a plurality of IC bumps and an encapsulating material encapsulating at least a portion of the silicon pad layer, the oxide layer, the interposer dielectric layer, and the IC die to provide structural support for the circuit assembly.

20 Claims, 32 Drawing Sheets

(51) Int. Cl.
*H01L 25/065* (2006.01)
*H01L 21/48* (2006.01)
*H01L 21/56* (2006.01)
*H01L 25/00* (2006.01)

(52) U.S. Cl.
CPC ............... *H01L 2924/15192* (2013.01); *H01L 2924/15311* (2013.01); *H01L 2924/181* (2013.01); *H01L 2924/18161* (2013.01)

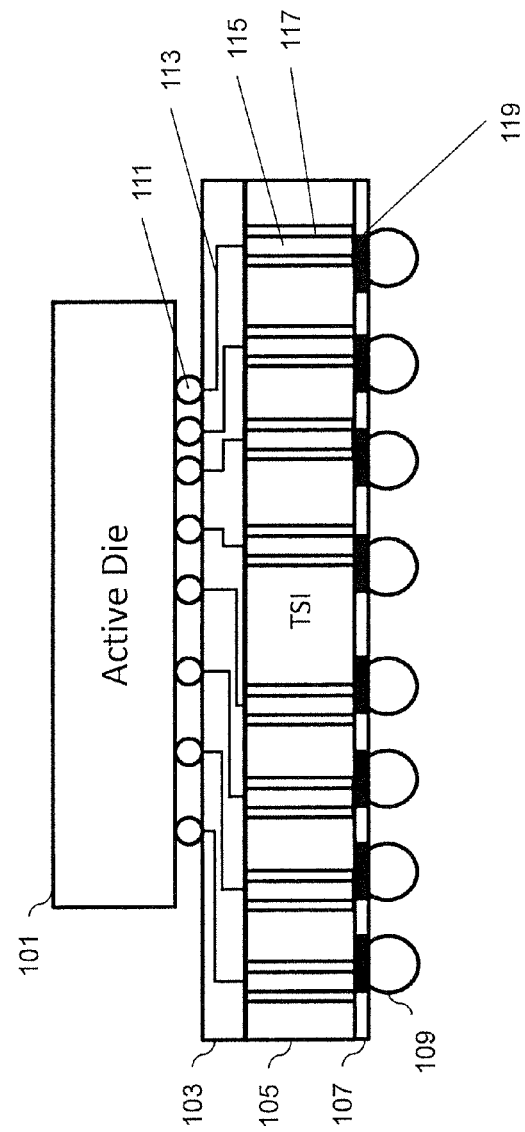
FIG. 1a
Conventional

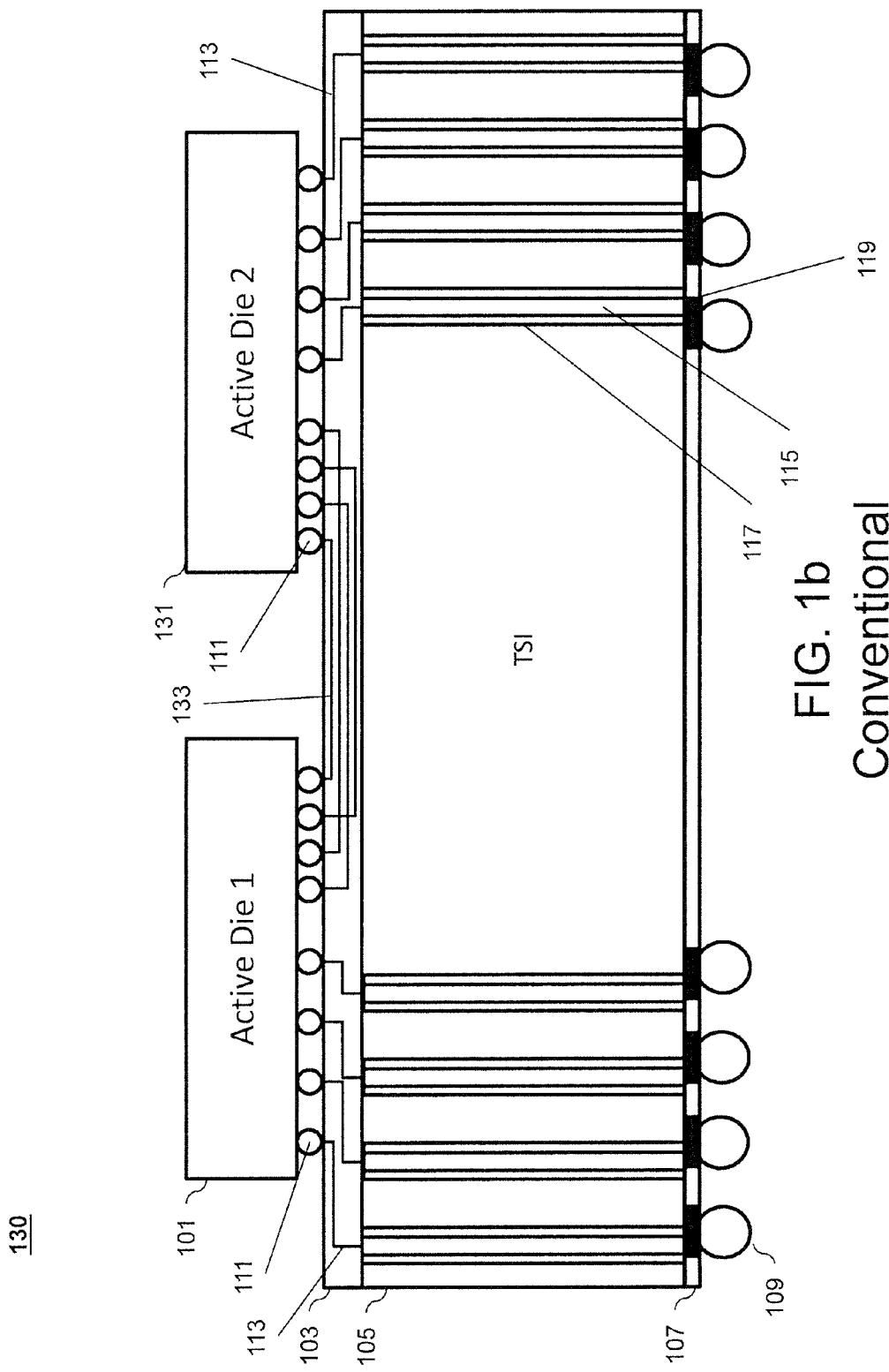
FIG. 1b
Conventional

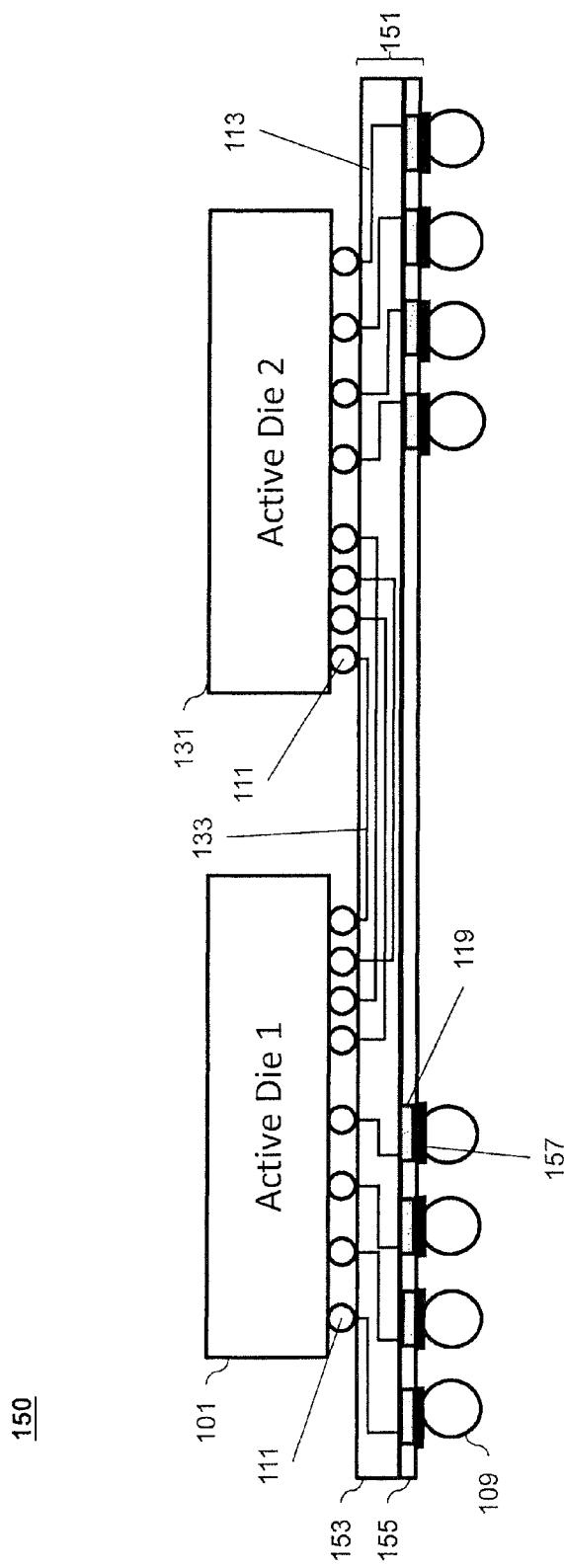
FIG. 1c
Conventional

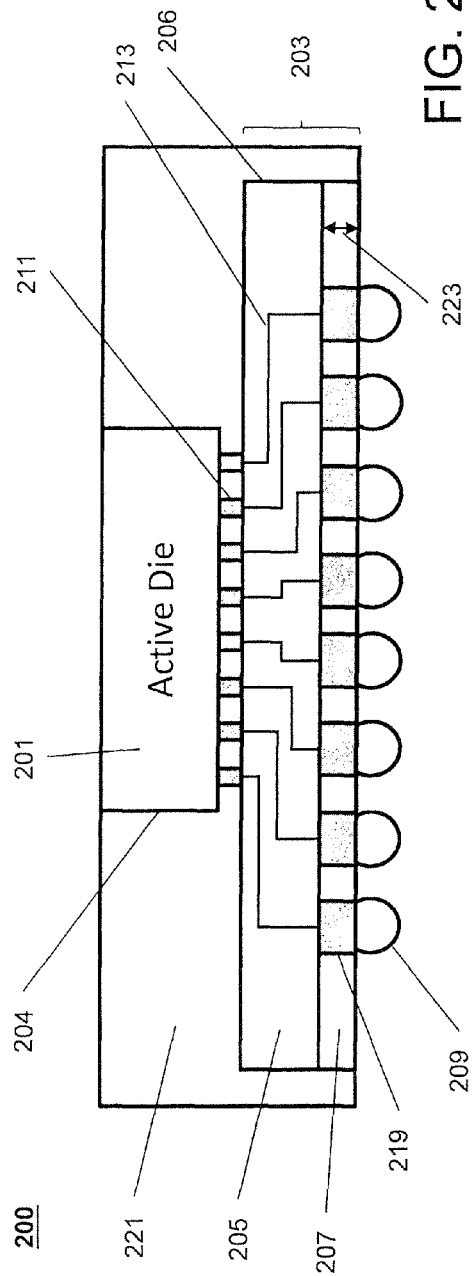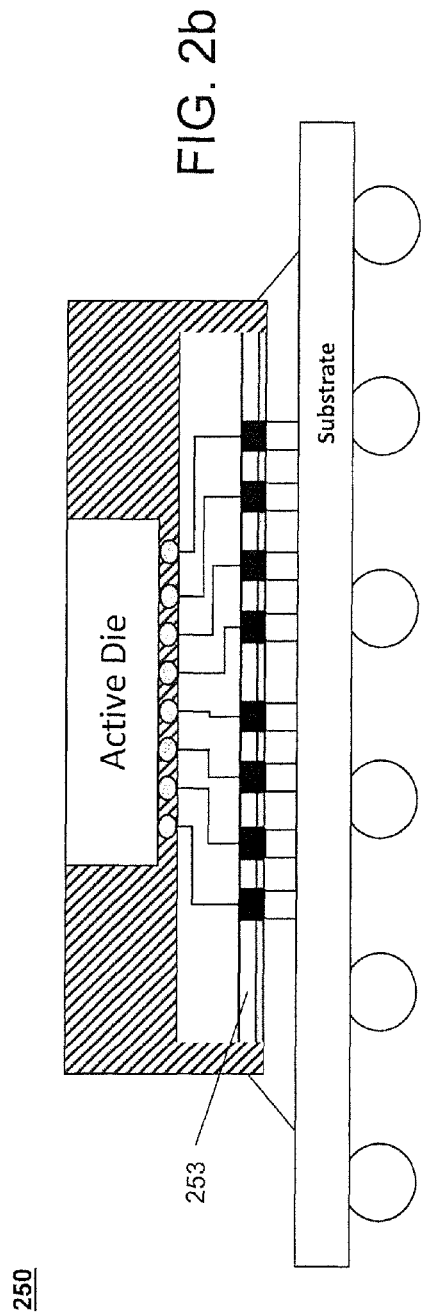

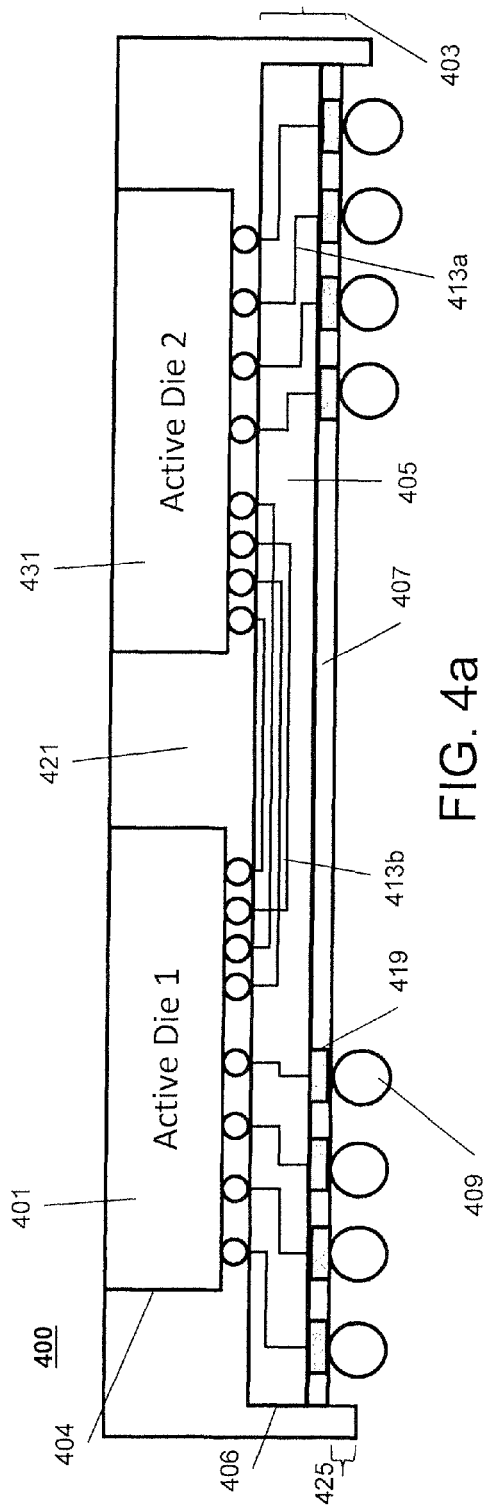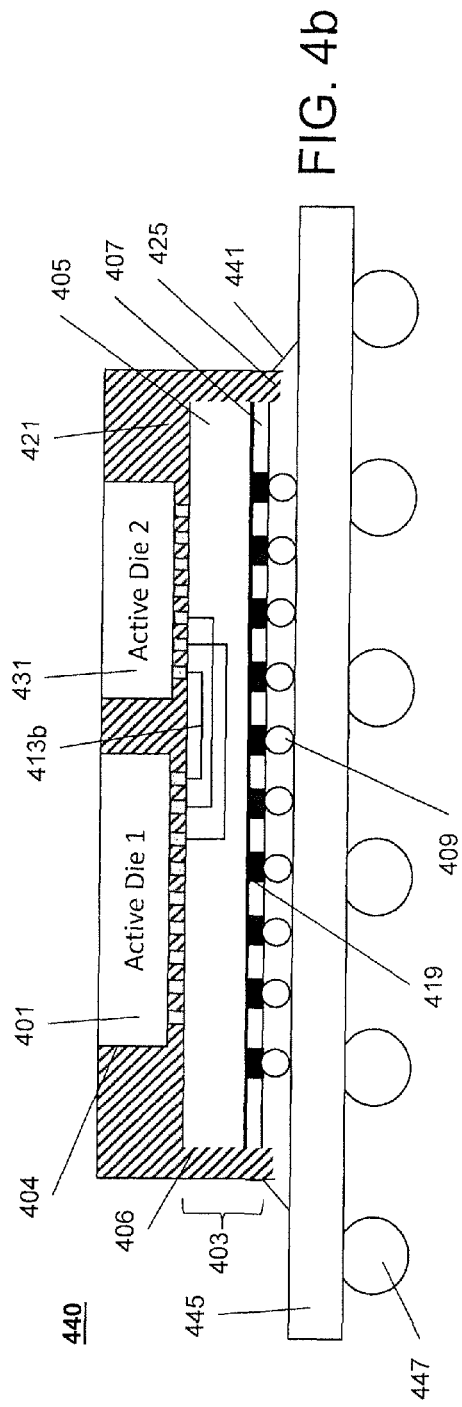

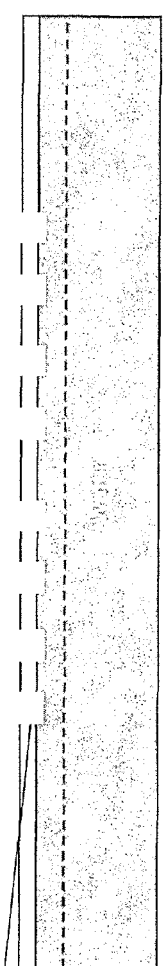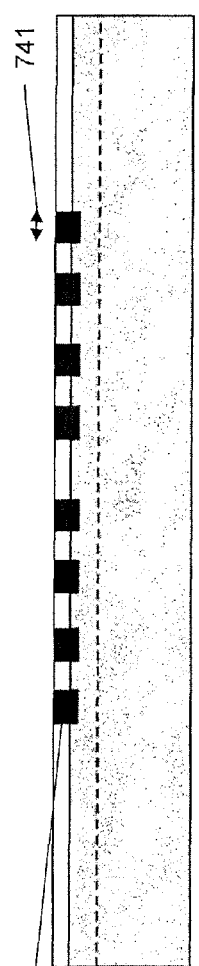

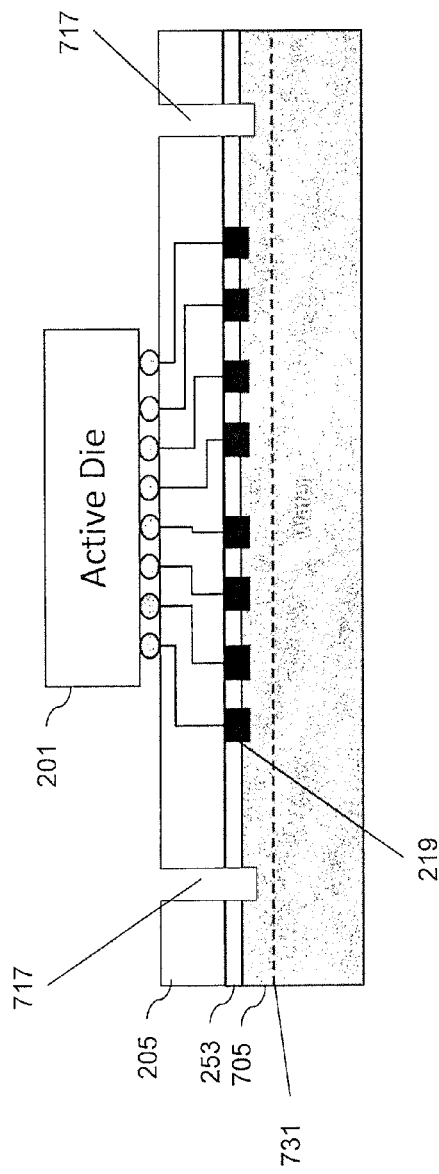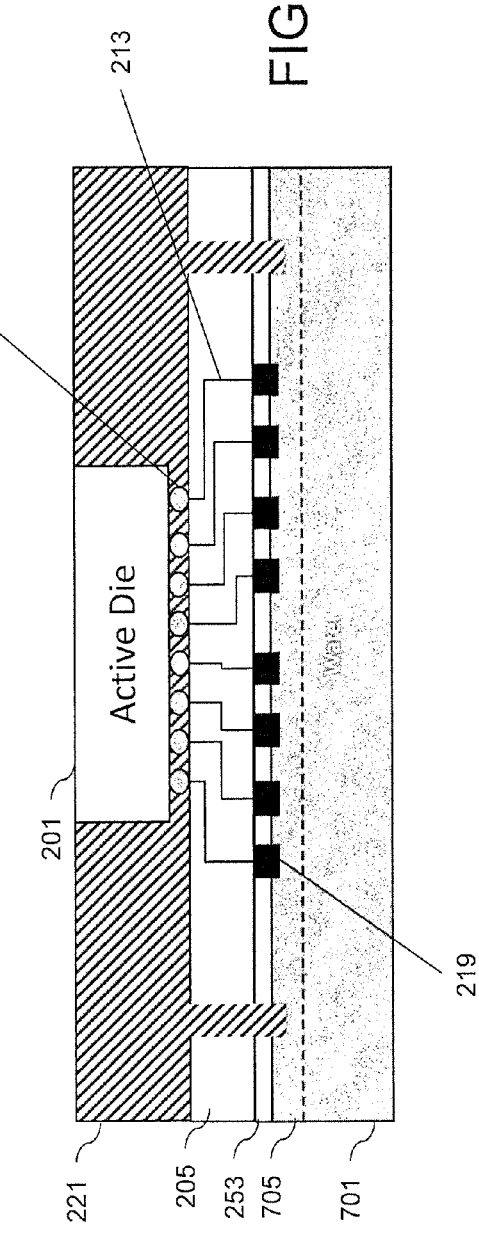

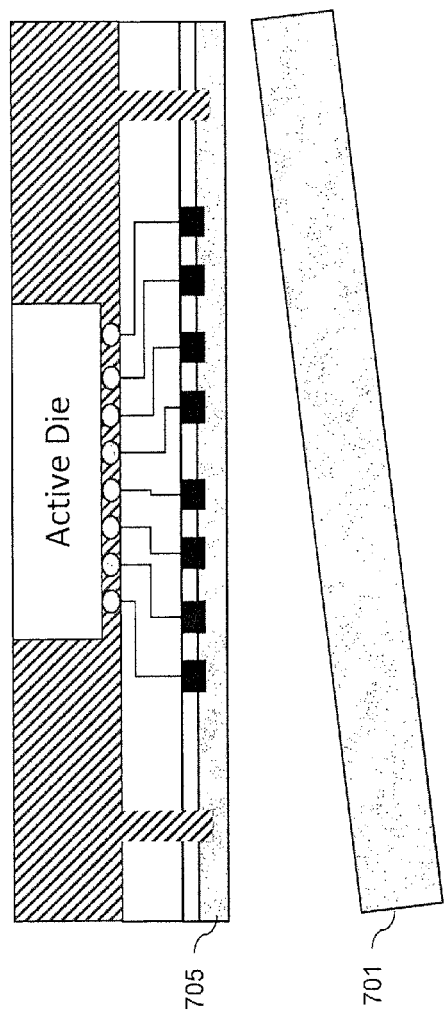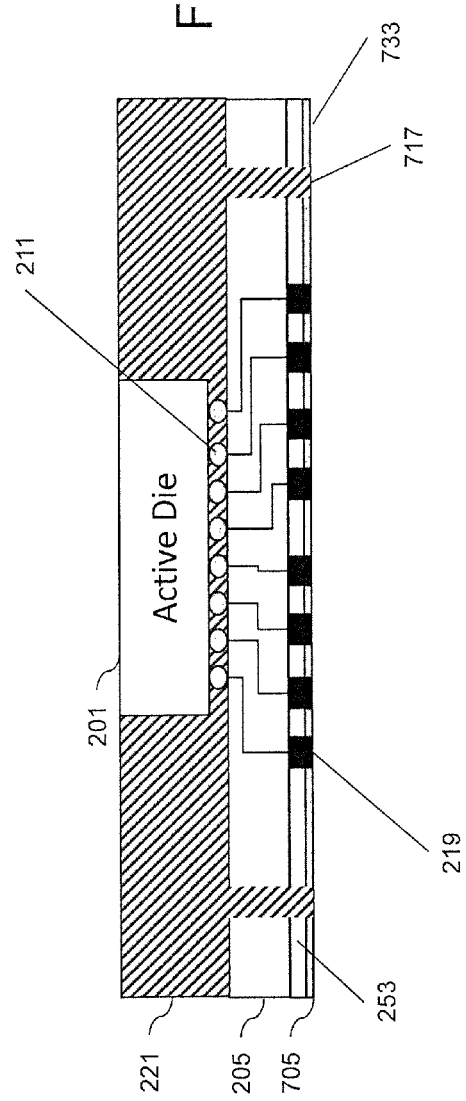

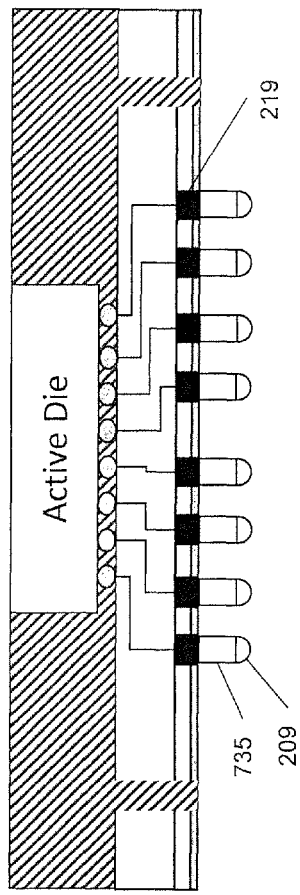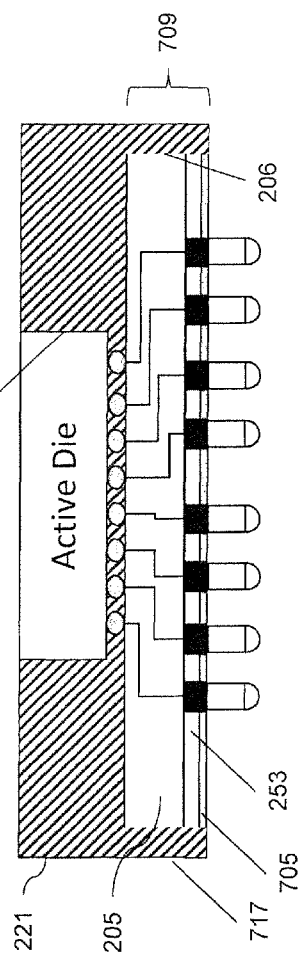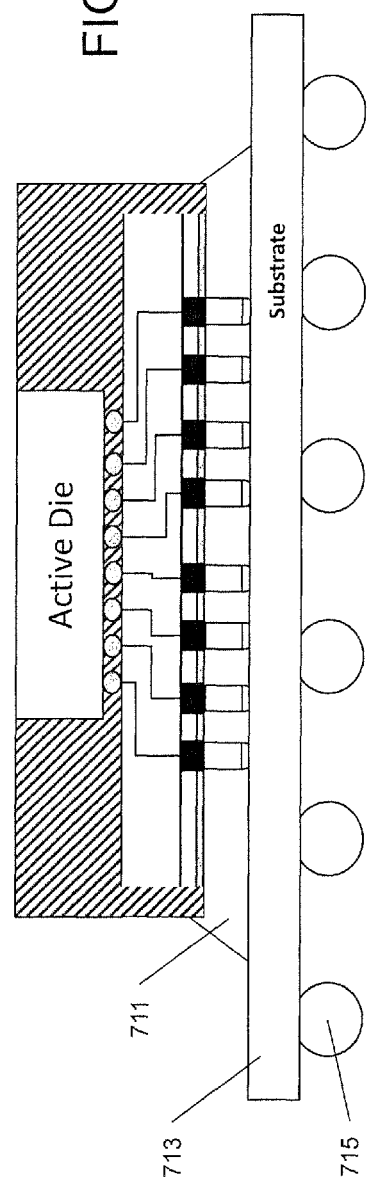

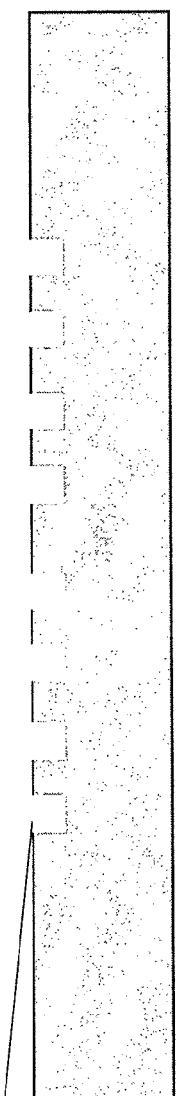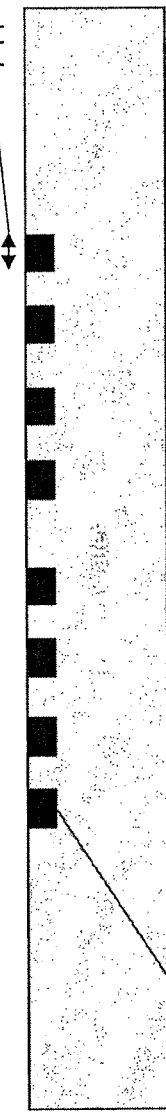

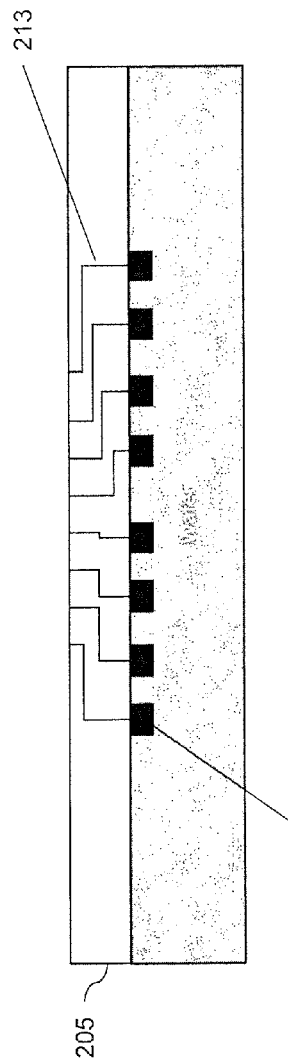
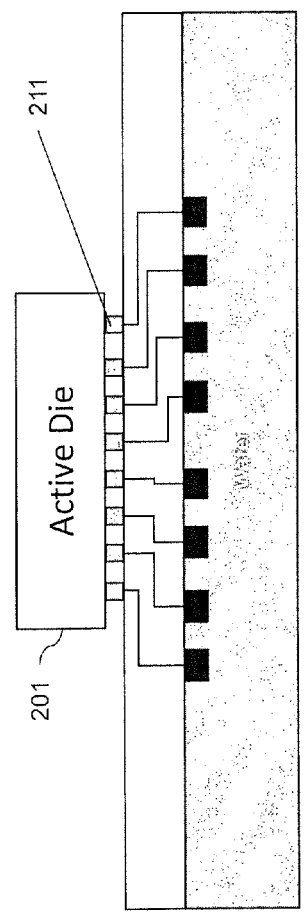
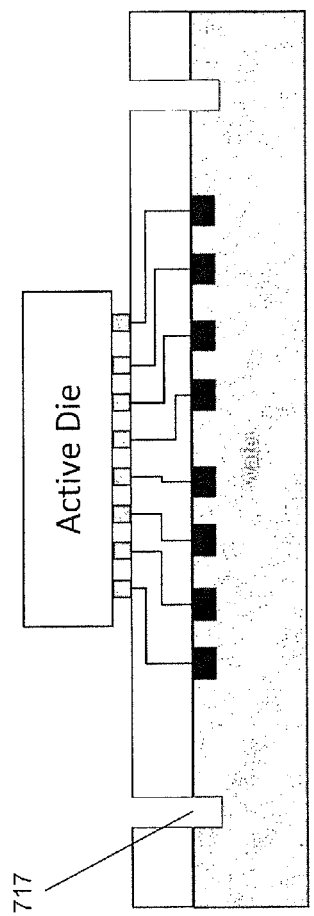

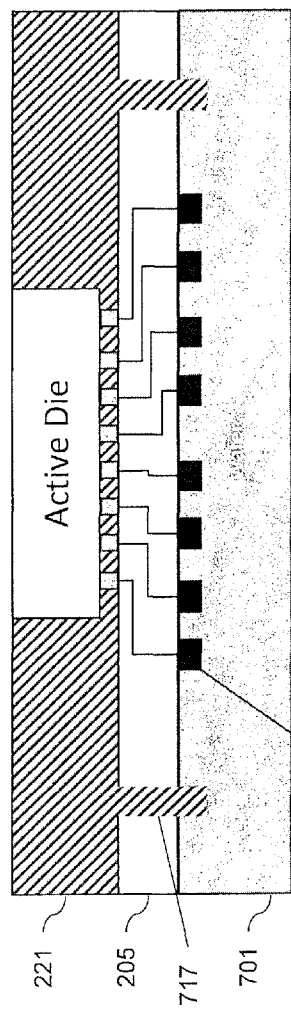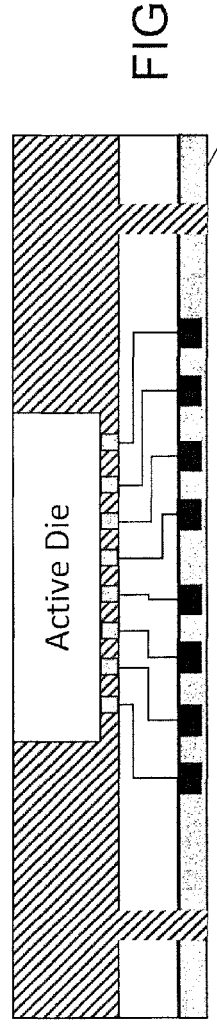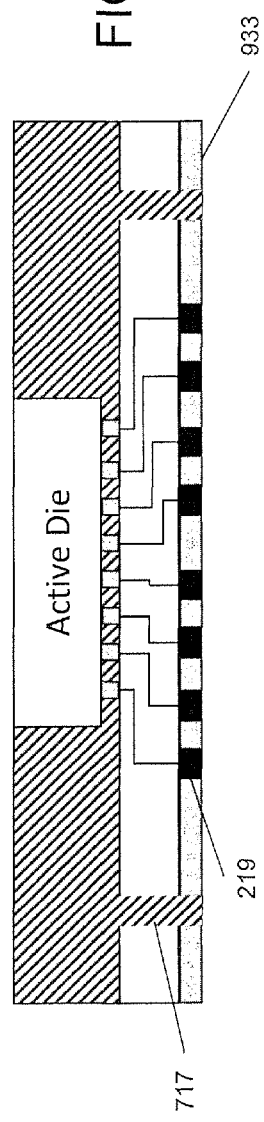

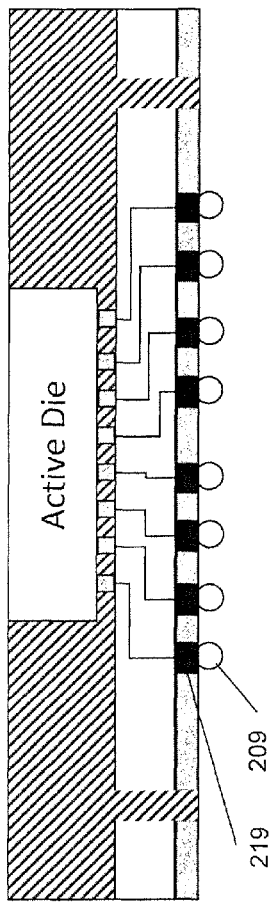
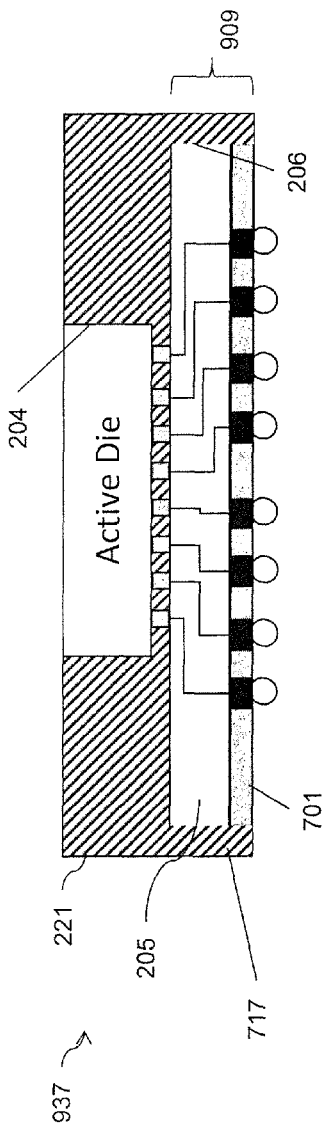
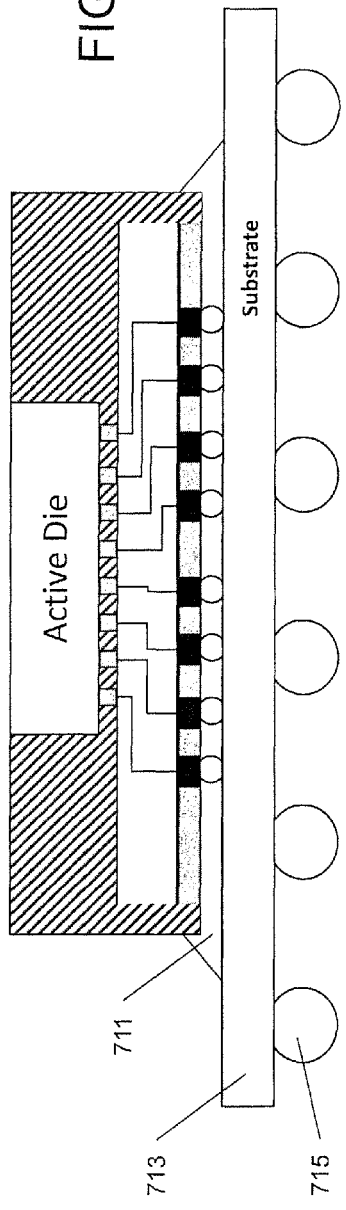

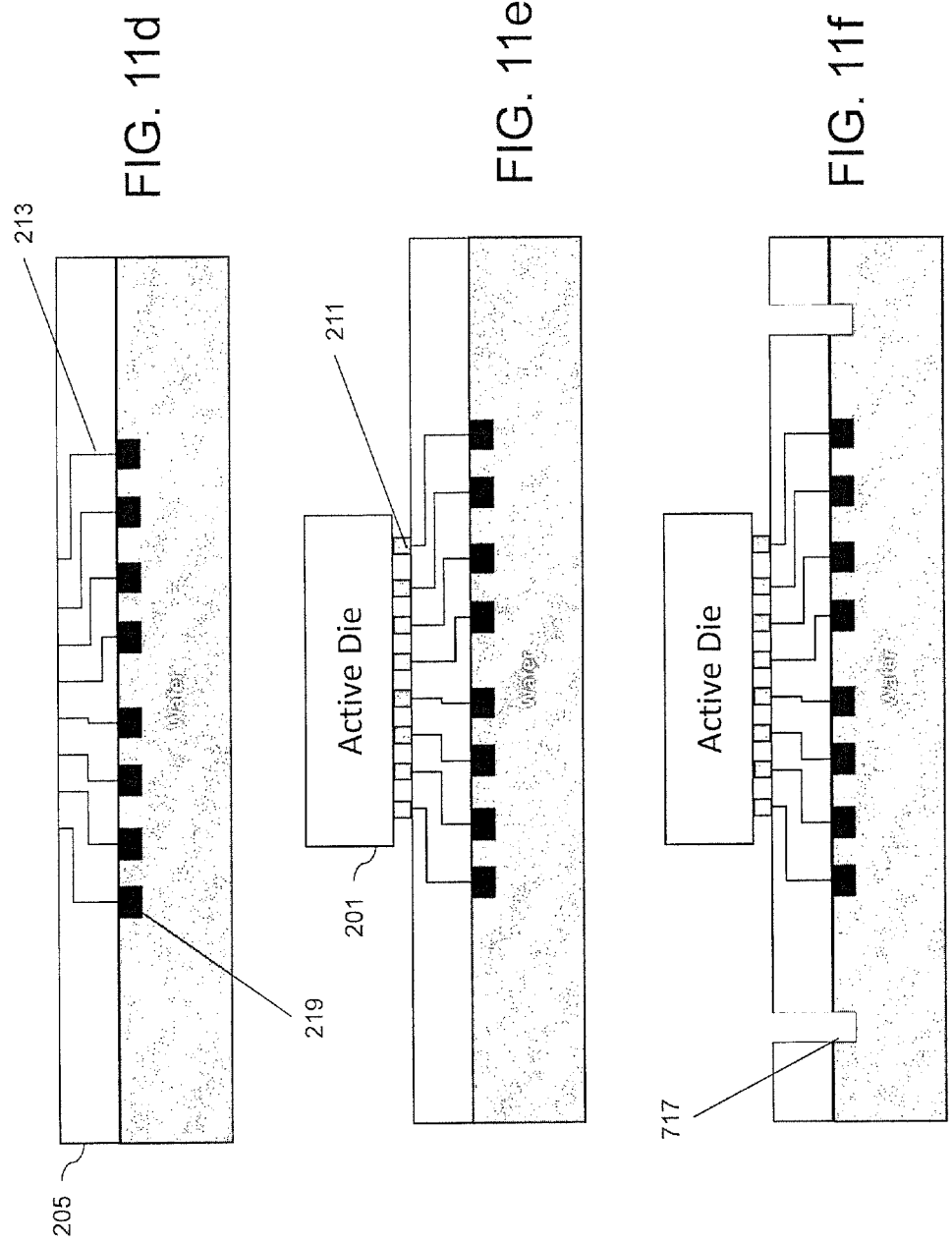

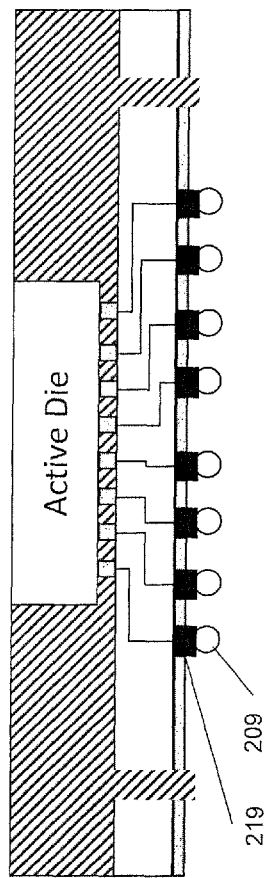
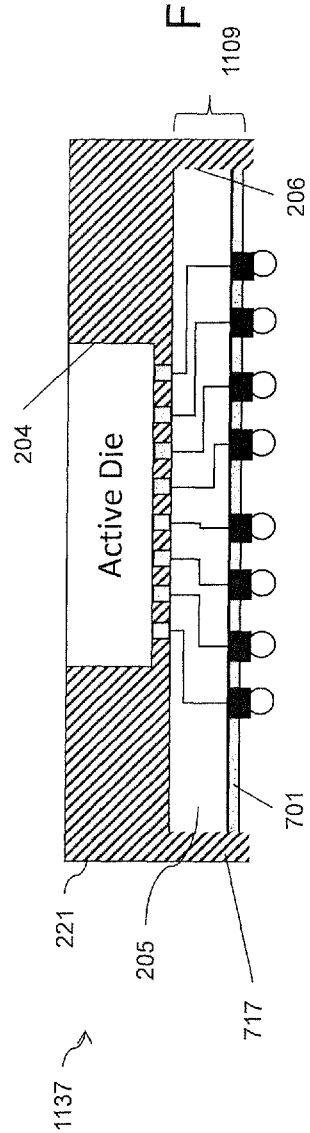
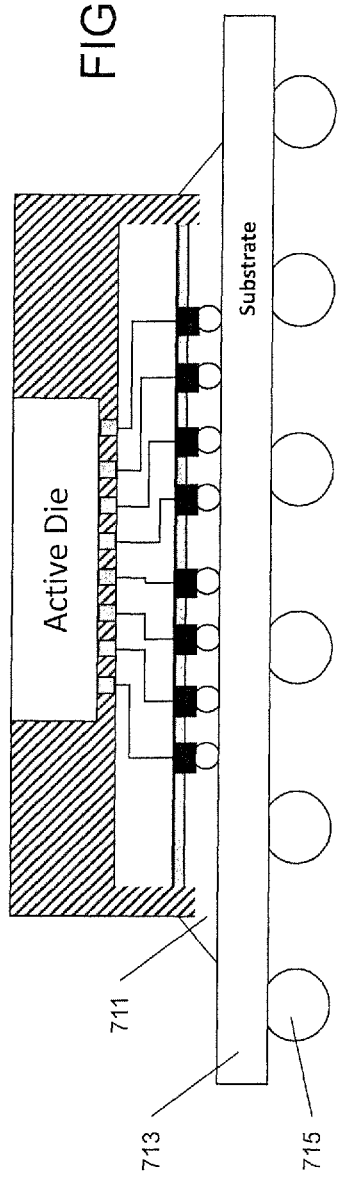

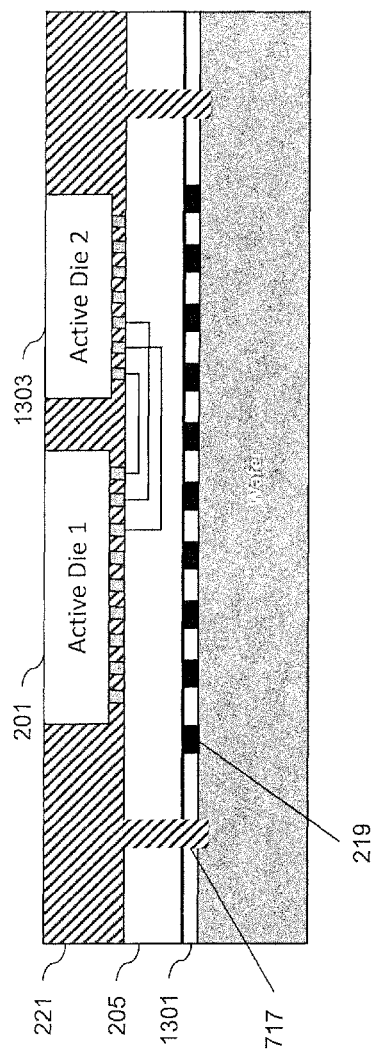
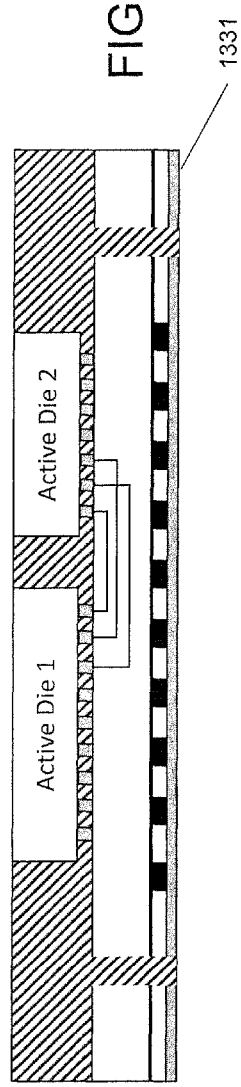
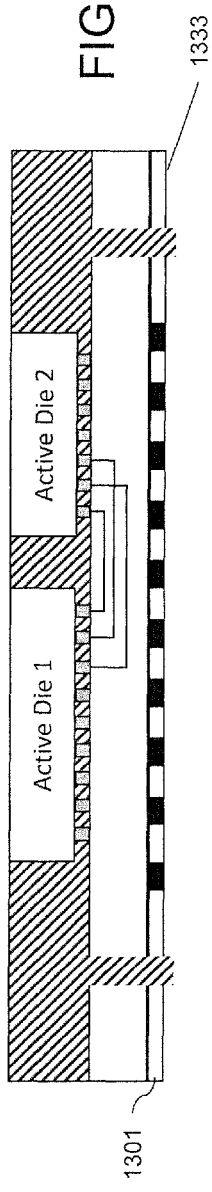

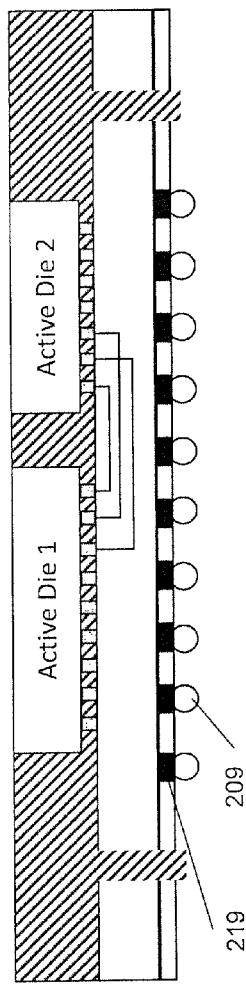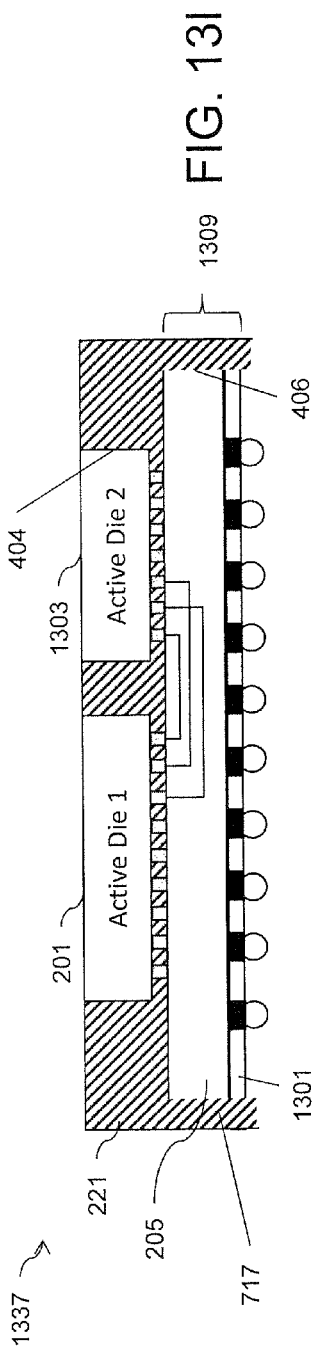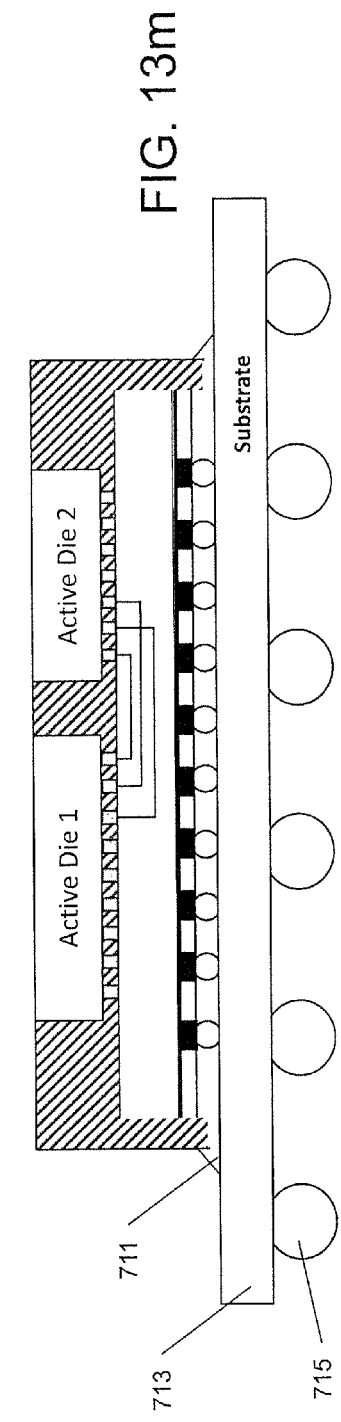

US 10,008,439 B2

THIN RECON INTERPOSER PACKAGE WITHOUT TSV FOR FINE INPUT/OUTPUT PITCH FAN-OUT

CROSS REFERENCE TO RELATED APPLICATIONS

The present application claims the benefit of U.S. Provisional Patent Application No. 62/190,687, filed on Jul. 9, 2015, which is hereby incorporated by reference in its entirety.

BACKGROUND

Field

The present disclosure relates generally to semiconductor devices and/or semiconductor packages with a thin recon interposer and without through-semiconductor-vias (TSVs).

Background Art

As the technology for making integrated circuits (ICs) improves, for example from 14 nm/16 nm process technology to 10 nm, 7 nm, 5 nm, and smaller, more functions are included in the semiconductor active IC dies, while the size of the semiconductor active die gets smaller. Similarly, the active semiconductor dies would require more input and output ports on a semiconductor substrate (e.g., packaging semiconductor substrate) as more input signals are sent to the IC dies for processing and more output signals are produced. As the size of the semiconductor active IC die gets smaller, the pin to pin pitch on the semiconductor active die gets smaller too. Smaller pin to pin pitch can result in a smaller pitch on input/output (I/O) terminals on the semiconductor substrate. I/O pads and bump pitch on a silicon IC die can be as small as 10 µm. However, substrate manufacturing and routing limitations can only allow around 120 µm I/O pitch for area array I/Os (flip chip bumps), thus forcing around 120 µm-130 µm bump pitches on a die for today's 40 nm, 28 nm, 20 nm, and 16 nm processes. As a result, the die size is increased (higher die cost) to accommodate required number of I/O.

In order to address the above issues, one or more interposers can be used. An interposer can be placed under the active semiconductor die and above the semiconductor substrate (e.g., a packaging semiconductor substrate). The interposer can be a through-silicon-via interposer (TSI) that is used for signal fan-out from a fine pin to pin pitch on the semiconductor active die to a coarse pitch I/O on the semiconductor substrate. TSI can act as an intermediate transition between a pitch of around 20-40 µm to a pitch of around 120 µm-180 µm. However, TSI can be expensive to manufacture and difficult to handle during package assembly process.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

FIGS. 1a-1c illustrate cross-sectional views of conventional semiconductor packages.

FIGS. 2a-2b illustrate cross-sectional views of semiconductor packages, in accordance with an embodiment of the present disclosure.

FIGS. 4a-4b illustrate cross-sectional views of semiconductor packages, in accordance with another embodiment of the present disclosure.

FIGS. 9a-9l illustrate a manufacturing process, in accordance with another embodiment of the present disclosure.

FIGS. 11a-11l illustrate a manufacturing process, in accordance with another embodiment of the present disclosure.

FIGS. 13a-13m illustrate a manufacturing process, in accordance with another embodiment of the present disclosure.

Figure 3:
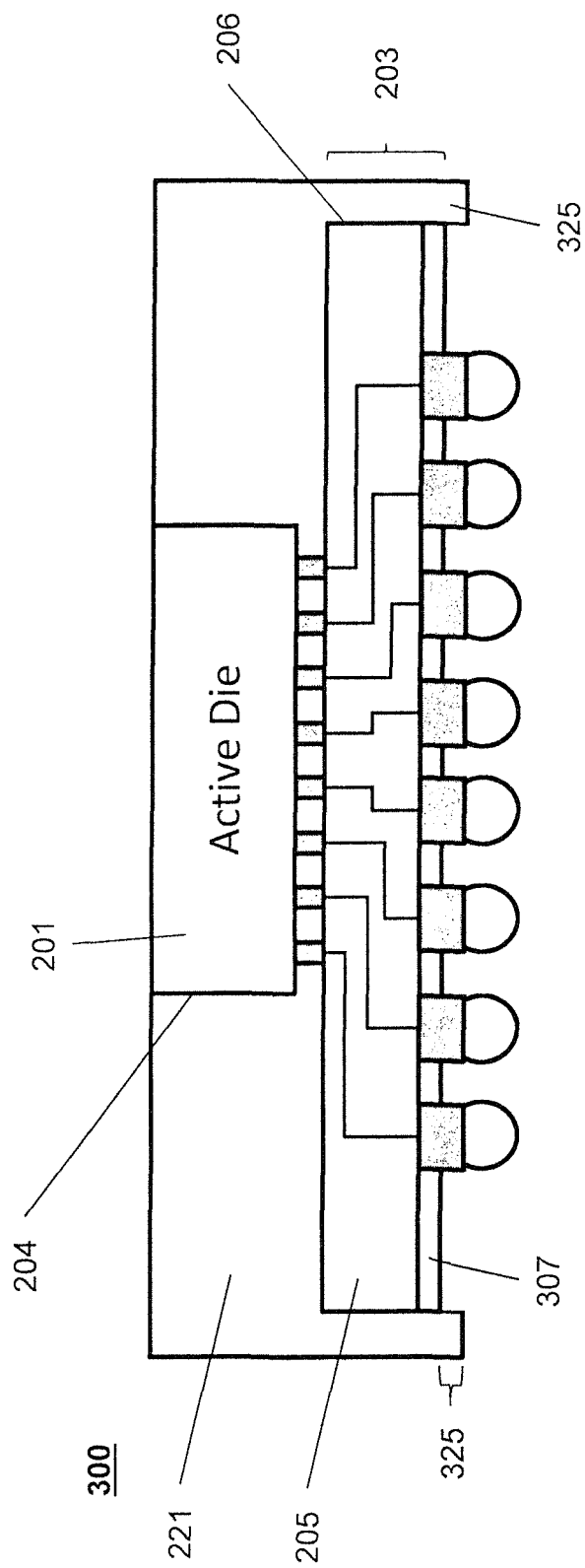
FIG. 3 illustrates a cross-sectional view of a semiconductor package, in accordance with another embodiment of the present disclosure.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Overview

Semiconductor devices and manufacturing methods are provided for using a Recon interposer that provides a high density interface between the active semiconductor die and the semiconductor substrate.

According to one embodiment of the disclosure, a circuit assembly includes a silicon pad layer including a plurality of metal pads, each metal pad configured to receive a corresponding bump of a plurality of bumps. The circuit assembly further includes an oxide layer disposed on the silicon pad layer and an interposer dielectric layer disposed on the oxide layer. The interposer dielectric layer includes a plurality of routing traces that connect a top surface of the redistribution layer to a bottom surface of the interposer dielectric layer. The circuit assembly further includes an integrated circuit (IC) die attached to the plurality of routing traces at the top surface of the interposer dielectric layer using a plurality of IC bumps and an encapsulating material encapsulating at least a portion of the silicon pad layer, the oxide layer, the interposer dielectric layer, and the IC die to provide structural support for the circuit assembly.

According to another embodiment of the disclosure, a circuit assembly includes a silicon pad layer including a plurality of metal pads, each metal pad configured to receive a corresponding bump of plurality of bumps. The circuit assembly further includes an interposer dielectric layer disposed on the silicon pad layer. The interposer dielectric layer including a plurality of routing traces that connect a top surface of the redistribution layer to a bottom surface of the interposer dielectric layer. The circuit assembly further includes an integrated circuit (IC) die attached to the plurality of routing traces at the top surface of the interposer dielectric layer using a plurality of IC bumps and an encapsulating material encapsulating at least a portion of the silicon pad layer, the oxide layer, the interposer dielectric layer, and the IC die to provide structural support for the circuit assembly.

According to one embodiment of the disclosure, a circuit assembly includes a dielectric layer including a plurality of metal pads, each metal pad configured to receive a corresponding bump of a plurality of bumps. The circuit assembly further includes an interposer dielectric layer disposed on the dielectric layer. The interposer dielectric layer including a plurality of routing traces that connect a top surface of the redistribution layer to a bottom surface of the interposer dielectric layer. The circuit assembly further includes an integrated circuit (IC) die attached to the plurality of routing traces at the top surface of the interposer dielectric layer using a plurality of IC bumps and an encapsulating material encapsulating at least a portion of the silicon pad layer, the oxide layer, the interposer dielectric layer, and the IC die to provide structural support for the circuit assembly.

DETAILED DISCUSSION

The following Detailed Description of the present disclosure refers to the accompanying drawings that illustrate exemplary embodiments consistent with this disclosure. The exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein. Therefore, the detailed description is not meant to limit the present disclosure.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1a illustrates a cross-sectional view of a conventional semiconductor package 100. Semiconductor package 100 includes an active semiconductor IC die 101 formed over oxide dielectric layers 103 and attached using micro-bumps 111. Oxide dielectric layers 103 is formed over through-silicon-via (TSV) interposer (TSI) 105 having a plurality of TSV 115, which are metal vias that pass through the entire thickness of the TSI 105. Interposer 105 can include and/or be formed over passivation layer 107. Passivation layer 107 can include under-bump metallizations (UBMs) 119. Solder balls 109 are formed under passivation layer 107. Solder balls 109 can be formed over a semiconductor substrate (e.g., a package substrate), which is not shown in this figured.

In one example, TSI 105 (in addition to and/or including oxide dielectric layers 103 and passivation layer 107) is configured to fan-out the pitch of micro-bumps 111 to the pitch of solder balls 109. In one example, the pitch of micro-bumps 111 is around 40 µm. However, the pitch of solder balls 109 can be around 120 µm-180 µm. In one example, the pitch of solder balls 109 can depend on the diameter of TSVs 115 and/or the thickness of TSI 105. For example, the larger the diameter of TSVs 115 and/or the larger the thickness of TSI 105, the larger the pitch of solder balls 109 can be. According to one example, solder balls 109 are regular C4 bumps configured to connect active semiconductor IC die 101 to the package substrate (through passivation layer 107, TSI 105, oxide dielectric layers 103, and micro-bumps 111) for I/O signals, power, and/or ground.

Oxide dielectric layers 103 include routing traces 113. TSI 105 includes TSVs 115, which are surrounded by dielectric isolation layer 117. In this example, micro-bumps 111 are electrically coupled to routing traces 113. Routing traces 113 are electrically coupled to TSVs 115, which are electrically coupled to UBMs 119. UBMs 119 are electrically coupled to solder balls 109, so as to implement the fan-out of electrical signals from the IC dies 101 to the solder balls 109. TSI 105 is formed from silicon, which can be hard, brittle, and subject to fracture. To make the TSVs 115, the silicon has to be etched from the top surface of the TSI 105 to bottom surface of the TSI 105, for example, using chemical processes. Then TSVs 115 (for example made of copper) and dielectric isolation layers 117 are created by filling the resulting holes with metal material. The material used for TSI 105 is usually an expensive material. Also, TSI 105 is expensive to manufacture at least due to the via drill requirement. Also, TSVs 115 adversely impact the bandwidth of the electrical signals that pass through them due to, for example, added signal path length of TSVs 115, and electrical conduction (leakage) that can occur between neighboring vias. TSI 105 can also be prone to fracture during manufacturing and package assembly processes due to, for example, many (e.g., thousands to hundreds of thousands of) TSVs 115 in TSI 105. In one example, active semiconductor IC die 101 can have a thickness of around 300 µm-400 µm. Although depending on the application, thickness of active semiconductor die 101 can be smaller (around 200 µm-300 µm, 100 µm-200 µm, or smaller) or larger. TSI 105 can have a thickness of around 100 µm. TSVs 115 and/or TSVs 115 and dielectric isolation layers 117 together can have a diameter of around 10 µm.

FIG. 1b illustrates a cross-sectional view of another conventional semiconductor package 130, which includes two active semiconductor IC dies 101 and 131 formed over oxide dielectric layers 103 using micro-bumps 111. Structures in FIG. 1b that are similar to the structures in FIG. 1a have the same reference number as used in FIG. 1a, and are described with respect to the discussion of FIG. 1a. In FIG. 1b, semiconductor package 130 includes two active semiconductor IC dies 101 and 131 that are electrically coupled to the package substrate (not shown) and are also coupled to each other. For example, four of micro-bumps 111 of active semiconductor IC die 101 and four of micro-bumps 111 of active semiconductor IC die 131 are electrically coupled to routing traces 113, which are electrically coupled to TSVs 105, which are electrically coupled to UMBs 107, which are electrically coupled to solder balls 109, so as to enable signal fan-out. Further, four of micro-bumps 111 of active semiconductor IC die 101 are electrically coupled to four of micro-bumps 111 of active semiconductor IC die 131 through routing traces 133 such that active semiconductor IC dies 101 and 131 can communicate with each other. In one example routing traces 133 can be placed within sub-micron distances from each other. For example, the distance between traces 133 can be around 0.5 µm. Therefore, oxide dielectric layers 103 and TSI 105 can provide a dense medium for active semiconductor dies 101 and 131 to communicate with each other.

It is noted that although two active semiconductor IC dies, four routing traces 133, four routing traces 113 for each active semiconductor IC die, eight TSV 115, eight UMBs 119, and eight solder balls 109 has been shown, semiconductor package 130 can include any number of these structures.

Similar to FIG. 1a, TSI 105 is expensive to manufacture due to, for example, the via formation requirement. Also, the I/O, power or ground bumps that directly connect to the package substrate (not shown) still must go through TSI 105. TSVs 115 can adversely impact the bandwidth of the electrical signals that pass through them, due to added signal path length of TSVs 115, and electrical conduction (leakage) between the neighboring vias. Also, dielectric isolation layer 117 is disposed between the via metal (TSV 115) and the substrate (TSI 105), to overcome the leakage issue, and the fabrication thereof is a time consuming and expensive process. So, these dielectric isolation layers are often very thin 1um thick.) Also, the integrity of this dielectric isolation layer 117, under stress conditions of TSI 105, is not known.

FIG. 1c illustrates a cross-sectional view of another conventional semiconductor package 150, which includes two active semiconductor IC dies 101 and 131 formed over interposer 151 using micro-bumps 111. According to this example, and in contrary to examples of FIGS. 1a and 1b, the semiconductor package 150 does not include through-silicon-vias interposer. Examples of semiconductor package 150 are discussed in U.S. Pat. No. 9,013,041, which is hereby incorporated by reference in its entirety.

In this example, interposer 151 includes an interposer dielectric 153 having routing traces 113 and 133 formed therein, layer 155, and connection pads 119 formed in layer 155 so as to contact routing traces 113 and 133. In one example, semiconductor package 150 can include pads 157 (such as, but not limited to copper pads) as an interface between connection pads 119 and solder balls 109. Structures in FIG. 1c that are similar to the structures in FIG. 1a and/or FIG. 1b have the same reference numbers and are described with respect to the discussion of FIG. 1a and/or FIG. 1b.

In one example, layer 155 can include a passivation layer. In this example, interposer 151 includes passivation layer 155 and connection pads 119 can include UMBs. Alternatively, layer 155 can include an interposer semiconductor. In this implementation, interposer 151 includes interposer semiconductor 155, in which connection pads 119 are formed. The thickness of this layer 155 can be around, for example, 1 µm-2 µm. In another example, this thickness can be smaller. Alternatively, the thickness can be larger, such as about or less than 10 µm. In this example, the no-substrate-via interposer 151 is thin (for example, around 5 µm-20 µm) and difficult to handle during manufacturing process. Special tools must be developed to handle the thin interposer and its assembles before and after manufacturing. Also, the stand-alone thin interposer 151 is prone to damage during transportation and manufacturing process.

FIG. 2a illustrates a cross-sectional view of a circuit assembly, such as a semiconductor package, according to an embodiment of the present disclosure. Semiconductor package 200 includes active semiconductor die 201 (such as an integrated circuit (IC) die), interposer 203, micro-bumps 211, bumps such as, but not limited to, solder balls 209, and encapsulation material 221. In this example, interposer 203 is an interposer without through-silicon-vias (TSVs). Interposer 203 can include interposer dielectric 205 having routing traces 213 formed therein, layer 207, and connection pads 219 formed in layer 207 so as to contact routing traces 213. Routing traces 213 are electrically coupled to micro-bumps 211. Micro-bumps 211 are configured to electrically connect active semiconductor die 201 to interposer 203. Solder balls 209 (also called "bumps") are also electrically coupled to connection pads 219 and also to a semiconductor substrate, such as a package substrate (not shown). Accordingly, active semiconductor die 201 is electrically coupled to the semiconductor substrate (e.g., the package substrate) through micro-bumps 211, interposer 203, and solder balls 209.

The no-TSV Interposer 203 is configured to fan-out the pitch of micro-bumps 211 to the pitch of solder balls 209. In one example, the pitch of micro-bumps 211 is around 10 µm, 20 µm, or 40 µm. However, the pitch of solder balls 209 can be around 120 µm-200 µm including, for example, around 120 µm-180 µm.

It is noted that although one active semiconductor die 201, eight micro-bumps 211, eight routing traces 213, eight connection pads 219, and eight solder balls 209 are shown in FIG. 2a, any number of these structures can be used in semiconductor package 200. Also, active semiconductor die 201 can be a packaged or an unpackaged die.

Interposer dielectric 205 may be formed of a flexible dielectric formed of a polyimide, silicon nitride, silicon oxide, a polyimide film or other suitable tape material. Alternatively, interposer dielectric 205 may be formed of a rigid dielectric material, such as fiber reinforced bismaleimide triazine (BT), FR-4, glass, or ceramic, for example. In some implementations, interposer dielectric 205 may be formed of an epoxy-phenolic or cyanate ester-epoxy build-up material. As a specific example, in one implementation, interposer dielectric 205 may be formed of an Ajinomoto™ Build-up Film (ABF). According to that exemplary implementation, routing traces 213 can be formed during a build-up process for forming interposer dielectric 205, using any suitable technique known in the art.

According to one embodiment, layer 207 can be a passivation layer. In this implementation, interposer 203 includes passivation layer 207 and connection pads 219 can include under-bump metallizations (UBMs). Passivation layer 207 may be an oxide, polyimide, or nitride layer ($Si_3N_4$, for example) layer, formed using a chemical vapor deposition process (CVD), or any other suitable process for producing passivation layer 207. It is noted that in some implementations passivation layer 207 may be omitted. UBMs 219 provide electrical connectivity between routing traces 213 and solder balls 209. UBMs 219 may be formed from a metal, metal alloy, multi-metal or multi-alloy stack, such as a multi-alloy stack including a combination of copper (Cu), nickel (Ni), titanium (Ti), tungsten (W), vanadium (V), chromium (Cr), and gold (Au), for example. UBMs 219 may be formed using an electrochemical deposition processes, for example, or any other suitable technique, as known in the art.

According to another embodiment, layer 207 can be from the same material as interposer dielectric 205, for example, an oxide dielectric layer. In this example, layer 207 can be formed, connection pads and/or UMBs 219 can be formed in layer 207, and interposer dielectric 205 can be formed on layer 207 (with same material as layer 207) including routing traces 213 (which can be formed during a build-up process for forming interposer dielectric 205, using any suitable technique known in the art).

According to another embodiment, layer 207 can be an interposer semiconductor. In this implementation, interposer 203 includes interposer semiconductor 207, in which connection pads 219 are formed and are extended through the interposer semiconductor 207. Interposer semiconductor 207 may be a Group IV semiconductor, such as silicon, for example, also called a silicon pad layer herein. However, and in contrast to conventional interposers including a semiconductor substrate through which TSVs are typically formed, interposer semiconductor 207 (e.g., silicon pad layer 207) may have a substantially reduced thickness. For example, rather than a thickness of approximately 100 microns (100 μm), or more, which is a typical semiconductor substrate thickness in conventional interposer implementations, reduced thickness 223 of interposer semiconductor 207 may be approximately twenty microns (20 μm), or less. In one implementation, for example, interposer semiconductor 207 may have thickness 223 in a range from approximately five microns to approximately twenty microns (5-20 μm).

Connection pads 219 may be formed of a conductive metal such as copper. For example, connection pads 219 may be realized through interposer semiconductor 207 by first etching or drilling cavities into a semiconductor wafer, filling the cavities with copper through a plating process, and backgrinding the semiconductor to expose connection pads 219. Unlike TSVs, which typically include a dielectric barrier layer and a conductive via fill material, connection pads 219 may be formed so as to extend through interposer semiconductor 207 without the presence of an intervening dielectric layer to isolate connection pads 219 from interposer semiconductor 207. Moreover, due to reduced thickness 223 of interposer semiconductor 207, semiconductor package 200 advantageously avoids, or substantially reduces, the semiconductor leakage and electrical coupling amongst TSVs that are known to adversely affect signals passing through TSVs in the conventional art.

The electrical connection between active semiconductor die 201 and interposer 203 is provided by micro-bumps 211. Also, the electrical connection between interposer 203 and the semiconductor substrate (e.g., the package substrate—not shown) is provided by solder balls 209. However, micro-bumps 211 and/or solder balls 209 may correspond to any electrical contact structure suitable for coupling active semiconductor die 201 to interposer 203 and/or interposer 203 to the semiconductor substrate. Thus, in other implementations, micro-bumps 211 and/or solder balls 209 may be replaced by any conductive structure suitable for forming stable electrical connections such as respective conductive posts or pillars, for example, metal posts or pillars formed of copper.

According to this embodiment, semiconductor package 200 further includes encapsulation material 221 configured to seal active semiconductor IC die 201 and the no-TSV interposer 203. In one example, encapsulation material 221 can include a molding compound. The molding compound can be the same compound used in molded packages. Encapsulation material 221 can cover the sidewalls 204 of active semiconductor die 201 and sidewalls 206 of interposer 203, protecting IC die 201 and interposer 203 from environmental and manufacturing process stresses that can cause damage. In one example, encapsulation material 221 is used to protect semiconductor package 200 and would make it easy to handle semiconductor package 200. For example, by protecting semiconductor package 200 and the sidewalls of IC die 201 and interposer 203, encapsulation material 221 can protect die 201 and interposer 203 and their sidewalls from environmental conditions such as heat, moisture, salt, etc. Therefore, encapsulation material 221 can protect different structures of semiconductor package 200 from, for example, delamination. Also, encapsulation material 221 helps protecting semiconductor package 200 when multiple semiconductor packages are formed and are needed to be separated from each other by, for example, a cutting process.

In one example, as shown in FIG. 2a, the bottom surface of interposer 203 is exposed such that connection pads (and/or UBMs) 219 can receive solder balls 209. In one example, solder balls 209 can be C4 bumps connecting to the package substrate for I/O signals, power, and/or ground. In one example, the surface of die 201 that is away from interposer 203 can be exposed for contact with heat sinking devices (such as, but not limited to heat sink, conductive heat spreader, etc.)

FIG. 2b illustrates a cross-sectional view of a circuit assembly, such as a semiconductor package, according to another embodiment of the present disclosure. Semiconductor package 250 is similar to semiconductor package 200 with the addition of an oxide layer 253. The circuit assembly of FIG. 2b (semiconductor package 250) is discussed in more detail with respect to FIG. 7n and the manufacturing process of FIGS. 6a-6b and 7a-7n.

FIG. 3 illustrates a cross-sectional view of a circuit assembly, such as a semiconductor package, according to another embodiment of the present disclosure. Semiconductor package 300 is very similar to semiconductor package 200 with similar structures. One difference between semiconductor package 300 and semiconductor package 200 is that encapsulation material 221 in semiconductor package 300 is extended below the bottom surface of interposer 203 (e.g., the surface of interposer 203 that is further away from die 201) in comparison to semiconductor package 200 of FIG. 2a. In other words, encapsulation material 221 covers die 201 and interposer 203 and covers the sidewalls 204 of die 201 and sidewalls 206 of interposer 203 and further extends below the bottom surface of interposer 203 such that encapsulation skirts 325 are formed.

In one embodiment, layer 307 is made from similar material as layer 207 of FIG. 2a. For example, layer 307 can be a silicon pad layer. Alternatively, layer 307 can be made of other material as discussed with respect to layer 207 of FIG. 2a. In one example, layer 307 of interposer 203 of FIG. 3 has a smaller thickness than layer 207 of interposer 203 of FIG. 2a such that encapsulation skirts 325 are formed. In this implementation, layer 307 of interposer 203 can be etched to reduce its thickness. As a result, the UMBs 219 extend beyond the bottom surface of the silicon pad layer 307. Additionally or alternatively, layer 307 of interposer 203 of FIG. 3 can have similar thickness as layer 207 of interposer 203 of FIG. 2a and encapsulation skirts 325 are formed when encapsulation material 221 is formed.

FIG. 4a illustrates a cross-sectional view of a circuit assembly, such as a semiconductor package, according to another embodiment of the present disclosure. Semiconductor package 400 includes two active semiconductor IC dies 401 and 431, interposer 403, and an encapsulation material 421. The encapsulation material 421 is used to seal active IC dies 401 and 431, the space between active dies 401 and 431 (such as integrated circuits (ICs) dies), and interposer 403. As discussed above with respect to FIGS. 2 and 3, encapsulating material 421 covers sidewalls 404 of active dies 401 and 403, and sidewalls 406 of interposer 403. In this example, encapsulating material 421 also includes mold skirts 425 that extend below the bottom surface of interposer 403.

In this example, interposer dielectric 405 include routing traces 413a that can electrically couple active IC dies 401 and 403 to solder balls 409 (and the package substrate—not shown) and also routing traces 413b that can electrically couple active IC dies 401 and 403 together.

In this implementation, layer 407 of interposer 403 can be a passivation layer as discussed above with respect to FIG. 2a. For example, passivation layer 407 can be Silicon Oxide ($SiO_2$ and/or $SiO$). Passivation layer 207 may be an oxide or nitride layer, such as a silicon nitride ($Si_3N_4$) layer, for example, formed using a chemical vapor deposition process (CVD), or any other suitable process for producing passivation layer 407. In this example, layer 407 is not a silicon substrate. In one example, layers 405 and 407 can be formed from same material. They can also be made from different dielectric materials.

In this implementation, connection pads 419 can be UBMs providing electrical connectivity between routing traces and solder balls 409. UBMs 419 may be formed as discussed above with respect to FIG. 2a. In one example, UBMs 419 can have a thickness similar to the thickness of layer 407. Alternatively, UBMs 419 can extend down from the bottom surface of layer 407 (for example as shown in FIG. 3.)

FIG. 4b illustrates a cross-sectional view of a circuit assembly, such as a semiconductor package, according to another embodiment of the present disclosure. Semiconductor package 440 is similar to semiconductor package 400. The combination of active IC dies, encapsulating material, and interposer are provided on semiconductor substrate (e.g., package substrate) 445 as a flip chip. In this example, solder balls 447 are provided on the bottom surface of package substrate 445. Solder balls 447 can be similar to solder balls 409 of FIG. 4a. Semiconductor package 440 can also include underfill material 441, which can be epoxy material.

Figure 5A:
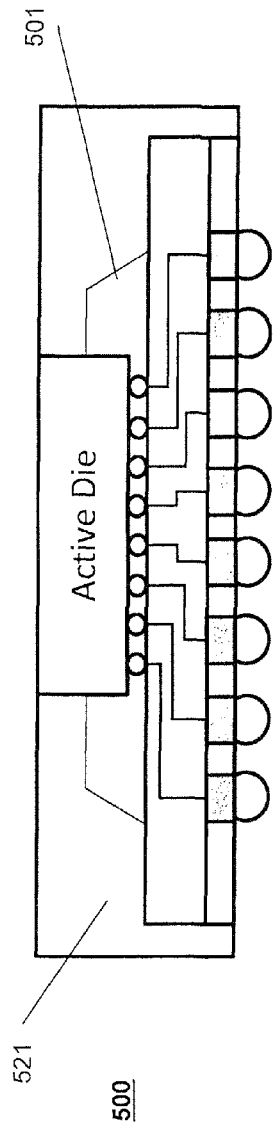
FIGS. 5a-5c illustrate cross-sectional views of semiconductor packages, in accordance with another embodiment of the present disclosure.
Figure 5B:
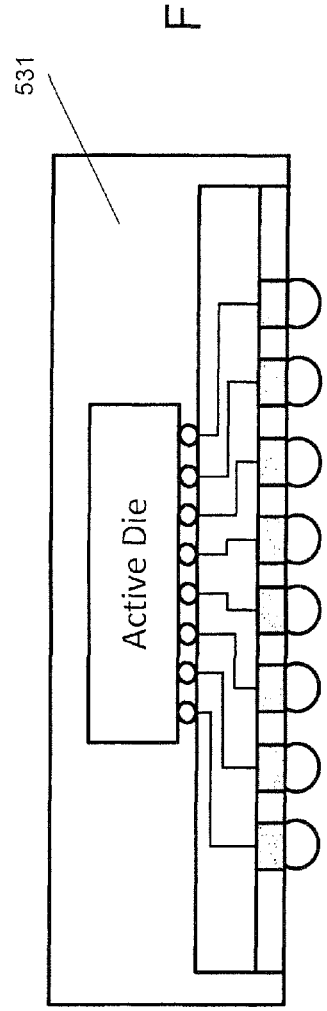
Figure 5C:
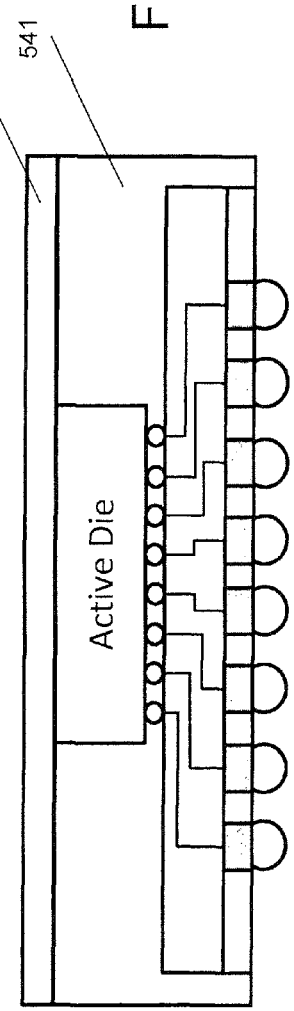

FIG. 5a-5c illustrate cross-sectional views of circuit assemblies, such as semiconductor packages, according to embodiments of the present disclosure. Semiconductor package 500 of FIG. 5a includes an underfill 501. Underfill 501 can be formed from polymer or liquid and is formed to cover the micro-bumps on the surface of the active IC die close to the interposer. Underfill 501 can be formed before encapsulating material 521 is formed around active IC die and the interposer.

Semiconductor package 530 of FIG. 5b includes encapsulating material 531, which is formed on and around the active IC die. In this example, the backside surface of the active IC die (the surface further away from the interposer) is not exposed and is covered with the encapsulating material 531.

Semiconductor package 540 of FIG. 5c includes an integrated heat spreader 543 that is formed over encapsulating material 541, and in contact with the active IC die.

Figure 6A:
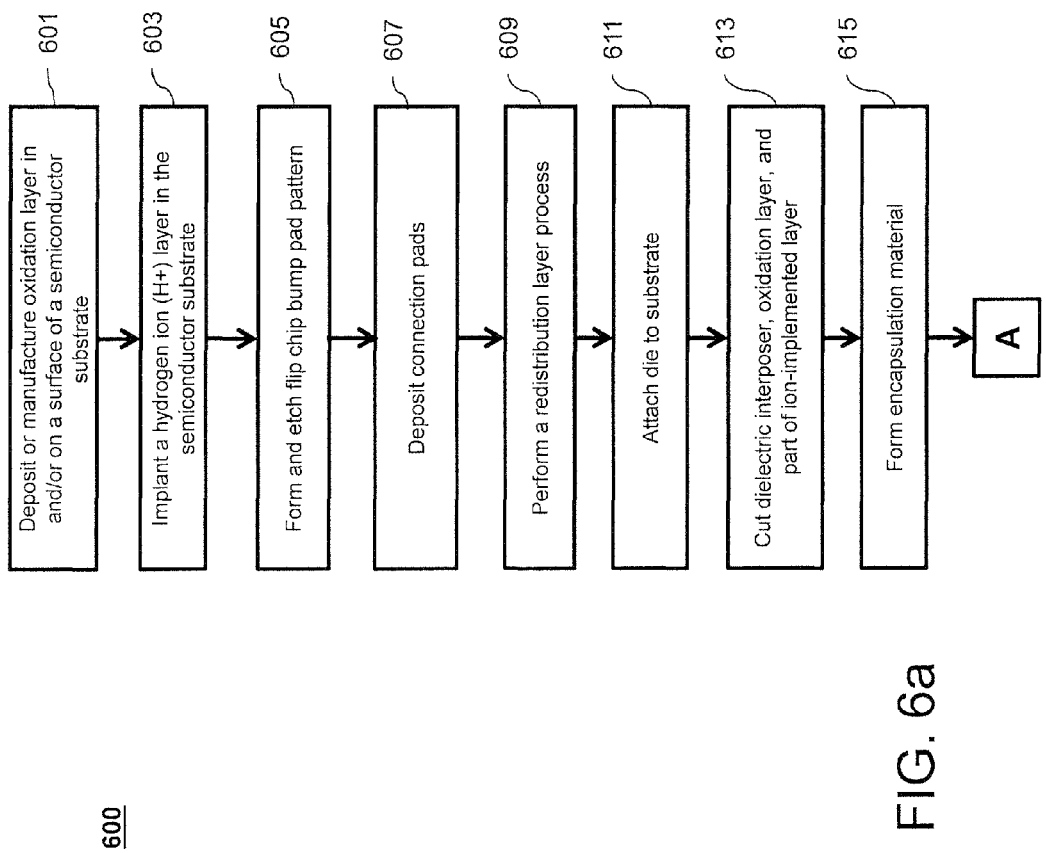
FIGS. 6a-6b are flowcharts illustrating a manufacturing process, in accordance with an embodiment of the present disclosure.
Figure 6B:
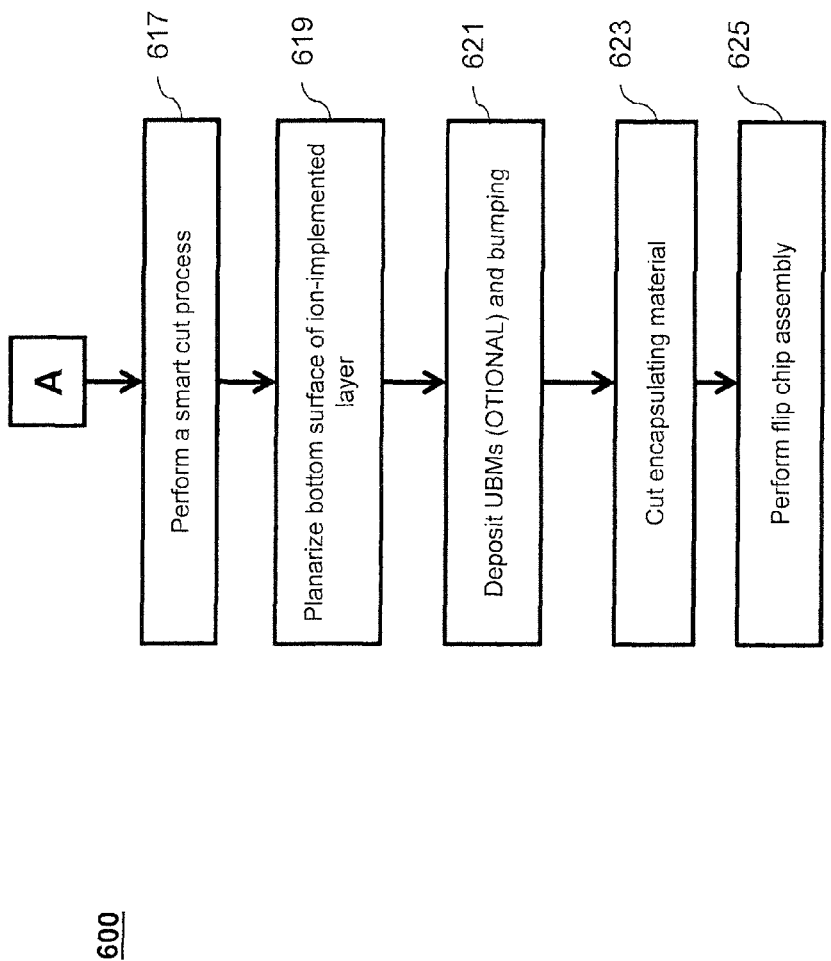

FIGS. 6a-6b and 7a-7n illustrate a manufacturing process for manufacturing circuit assemblies such as one or more semiconductor packages 200, 250, 300, 400, 440, 500, 530, and 540, in accordance with an embodiment of the present disclosure. The steps in the flowcharts of FIG. 6a-6b are illustrated in FIGS. 7a-7n. It is to be appreciated not all steps may be needed to perform disclosure provided herein. Further, some of the steps may be performed simultaneously, or in a different order than that shown in FIGS. 6a-6b and 7a-7n, as will be understood by those skilled in the art.

In step 601, as shown in FIG. 7b, an oxide layer 253 is deposited or manufactured in and/or on a surface of semiconductor substrate 701. Semiconductor substrate 701 may be any semiconductor substrate such as silicon, germanium, gallium, compounds of gallium, etc. In one example, oxide layer 253 is an insulator layer. In one example, step 601 can be part of a silicon on insulator (SOI) process and/or a smart cut process. In one implementation, step 601 can include oxygen beam implantation process followed by high temperature annealing. It is noted that other processes for fabricating oxide layer 253 known in the art can also be used.

In step 603, as shown in FIG. 7c, hydrogen ions ($H^+$) are implanted and/or diffused semiconductor substrate 701 to form diffused layer 705. In this process hydrogen ions ($H^+$) are diffused into a certain depths underneath the substrate's 701 surface to form layer 705, which can be a silicon pad layer 705. In one example, step 603 can be part of the silicon on insulator (SOI) process and/or the smart cut process. As discussed below, silicon pad layer 705 improves the cleaving of semiconductor substrate 701 along the border between silicon pad layer 705 and the rest of substrate 701. The ion implantation can form a weakened silicon pad layer 705 to enable the cleaving of the substrate 701. It is noted that processes known in the art for implanting hydrogen ion can be used.

In step 605, as shown in FIG. 7d, flip chip bump pad pattern 707 is formed and etched in, for example, layers 253 and 705. Forming and etching pattern 707 can include any etching process known in the art. For example, a mask having a pattern similar to pattern 707 can be put on top of layer 253 and trenches are etched through oxide layer 253 and silicon pad layer 705. The depth of the etched trenches is shallow and does not extend beyond border 731 (the border between silicon pad layer 705 and the rest of substrate 701.)

In step 607, as shown in FIG. 7e, the etched trenches of pattern 707 are filled with metal fill to form connection pads 219 (e.g., metal pads). In one example, step 607 can include depositing metal on oxide layer 253 and inside trenches of pattern 707 and then planarization of the surface of oxide layer 253 so that the residue metal is removed from non-patterned surface and the overall surface is flat. Pads 219 may be formed from a metal, metal alloy, multi-metal or multi-alloy stack, such as a multi-alloy stack including a combination of copper (Cu), nickel (Ni), titanium (Ti), tungsten (W), vanadium (V), chromium (Cr), and gold (Au), for example. Pads 219 may be formed using an electrochemical deposition processes, for example, or any other suitable technique, as known in the art.

As discussed before, pads 219 can include connection pads, C4 pads, flip chip bumps, UBMs, etc. In one example, diameter (or length) 741 of pads 219 can be around 65 μm-100 μm. However, diameter (or length) 741 of pads 219 can be smaller such as, but not limited to, around 25 μm or around 1 μm-2 μm. Also, it is noted that forming pattern 707 and filling them with metal fill to form connection pads 219 does not require lining inside of pattern 707 with, for example, isolation material as done in preparing vias in TSV (as discussed above with respect to, for example, FIG. 1b.) In one implementation, the pitch between connection pads 219 can depend on the package substrate requirements and/or the diameter (or length) 741 of pads 219. In one example, the pitch can be as small as twice the diameter (or length) 741 of pads 219.

Figure 7F:
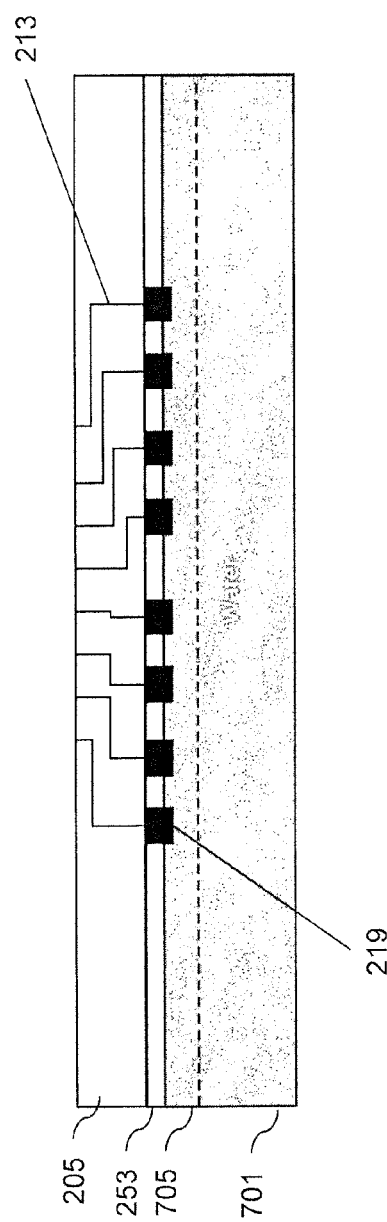
FIGS. 7a-7n illustrate a manufacturing process, in accordance with an embodiment of the present disclosure.

In step 609, as shown in FIG. 7f, a redistribution layer (RDL) process is performed to form a redistribution layer such as interposer dielectric layer 205 that includes routing traces 213. In on example, routing traces 213 are configured to connect a top of surface of the redistribution layer such as interposer dielectric layer 205 to a bottom surface of the redistribution layer such as interposer dielectric layer 205. Additionally or alternative, routing trace 213 are configured to electrically couple two or more active dies located over the redistribution layer such as interposer dielectric layer 205. The RDL process can include known processes in the art to form, for example, layers of dielectric material can be interleaved with layers of metal during the RDL process. The metal layers stacked within dielectric layers and on each other and/or on dielectric layers form the routing traces 213. In one example, there are metal vias to connect adjacent RDL metal layers. These interconnect vias are made during a back end process and are different from the vias in TSI.

Figure 7G:
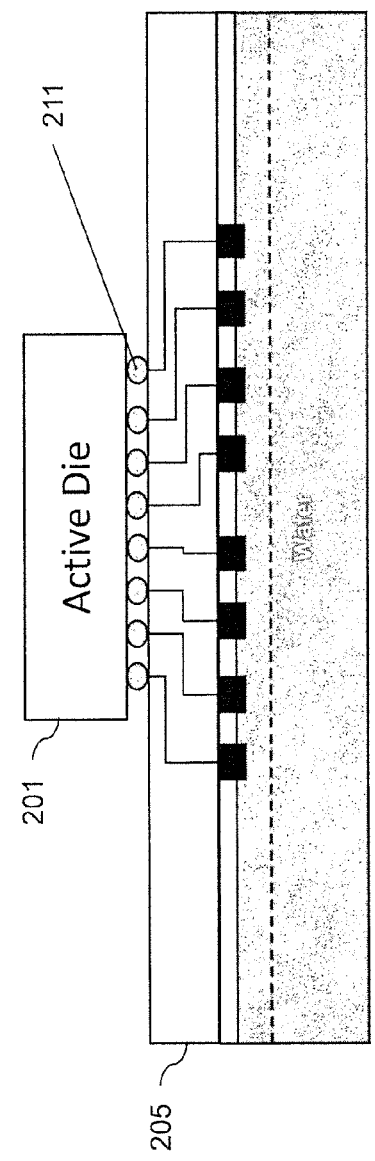

In step 611, as shown in FIG. 7g, an active semiconductor IC die 201 with micro-bumps 211 is attached to dielectric interposer 205. Bumps 211 can be micro-bumps, solder bumps, copper pillar, a combination thereof, or any structure suitable for connecting active die 201 to dielectric interposer 205. Bumps 211 may be formed from a metal, metal alloy, multi-metal or multi-alloy stack, such as a multi-alloy stack including a combination of copper (Cu), nickel (Ni), tin (Sn), silver (Ag), titanium (Ti), tungsten (W), vanadium (V), chromium (Cr), and gold (Au), for example. Bumps 211 may be formed using an electrochemical deposition processes, for example, or any other suitable technique, as known in the art.

In step 613, as shown in FIG. 7h, dielectric interposer 205, oxide layer 253, and part of silicon pad layer 705 are vertically cut and/or grooved to form trenches 717 at both sides of active die 201. This cutting process can be a laser cut and/or a mechanical cut. In one example, trenches 717 stop in silicon pad layer 705 before reaching border 731 (border between silicon pad layer 705 and the rest of substrate 701.) However, trenches 717 can have any depth depending on the process. In one example, trenches 717 can go in layer 705 as deep as (or as similar depth as) connection pads 219. Alternatively, trenches 717 can be shallower or deeper than connection pads 219. In one implementation, trenches 717 and connection pads 219 in layer 705 are not deeper than border 731 such that the rest of substrate 701 that is cut can be used for other processes.

In step 615, as shown in FIG. 7i, encapsulation material 221 is formed and is planarized. In one example, encapsulation material 221 is formed over and around active die 201, inside trenches 717, over dielectric interposer 205, and between active die 201 and dielectric interposer 205. Next, a planarization process can be performed such that the back side of active die 201 (the side further away from dielectric interposer 205) is exposed. In other words, the surface of encapsulation material 221 further away from dielectric interposer 205 would be in the same plane as the back side of active die 201. In one example, encapsulation material can include molding compound materials such as, but not limited to, thermoset epoxy material.

In step 617, as shown in FIG. 7j, a smart cut process is performed to remove the rest of substrate 701 from silicon pad layer 705 at, for example, border 731. Smart cut technique is discussed in, for example, U.S. Pat. No. 5,374,564, which is hereby incorporated by reference in its entirety.

In step 619, as shown in FIG. 7k, the bottom surface 733 of silicon pad layer 705 is planarized such that connection pads 219 and encapsulation material in trenches 717 are revealed, and therefore accessible. In one example, the planarization can include planarization of connection pads 219 and/or encapsulation material in trenches 717, depending on their depths in layer 207. Additionally, silicon pad layer 705 can further be etched (as discussed below with respect to, for example, FIG. 11i) such that connection pads 219 and encapsulation material in trenches 717 be extended below the bottom surface 733 of silicon pad layer 705. This additional etching implementation can result in encapsulation material skirts shown, for example, as skirts 325 in FIG. 3.

In step 621, as shown in FIG. 7l, under bump metallization (UBMs) 735 and bumps 209 are deposited on connection pads 219. In one example, UBMs 735 are optional and therefore, the deposition of UBMs 735 is an optional process and bumps 209 can be directly deposited on connection pads 219. In one example, bumps 209 can be copper pillars, solder bumps, or other connection means for connecting active IC die 201 to package substrate. UBMs and/or bumps may be formed from a metal, metal alloy, multi-metal or multi-alloy stack, such as a multi-alloy stack including a combination of copper (Cu), nickel (Ni), titanium (Ti), tin (Sn), silver (Ag), tungsten (W), vanadium (V), chromium (Cr), and gold (Au), for example. UBMs and/or bumps may be formed using an electrochemical deposition processes, for example, or any other suitable technique, as known in the art.

In step 623, as shown in FIG. 7m, encapsulating material 221 is cut through trenches 717 (to form the flip chip die 737) such that encapsulating material 221 covers around active die 201, the sidewalls 204 of active die 201, top of interposer 709 (which includes dielectric interposer 205, oxide layer 253, silicon pad layer 705), and the sidewalls 206 of interposer 709. In one example, a sawing process is performed to cut the encapsulating material 221 (and any part of substrate 701 is left.) In one implementation, multiple semiconductor packages are prepared neighboring each other using the processes of FIGS. 6a-6b and 7a-7n and in step 623 all the multiple semiconductor packages are separated using the sawing process.

In step 625, as shown in FIG. 7n, flip chip die 737 is attached to semiconductor substrate (e.g., package substrate) 713. In one example, underfill material 711 is formed (e.g., dispensed) during the assembly underneath the flip chip die 737 around UBMs 735 and/or bumps 209 to protect UBMs 735 and/or bumps 209. In one example, underfill material 711 can be epoxy material. However, underfill material 711 can be different from and/or has different properties than encapsulating material 221, for example a different formula of epoxy. Solder balls 715 are also formed on package substrate 713.

Although only one active IC die 201 is shown in the processes of FIGS. 6a-6b and 7a-7n, these processes can be performed for any number of IC dies.

As discussed above with respect to the processes of FIGS. 6a-6b and 7a-7n, encapsulating material 221 is formed to cover at least parts of active IC die 201, dielectric interposer 205, oxide layer 253, silicon pad layer 705 before the rest of wafer 701 is cut (FIG. 7j), planarization of FIG. 7k is performed, the encapsulating material is sawed (FIG. 7l), and other processes for assembling the flip chip die are performed. This early formation of the encapsulating material makes handling the semiconductor package easier during manufacturing process and also during assembly, because the semiconductor package absent the encapsulating material can be a fragile structure, and therefore prone to damage. Semiconductor package with the encapsulating material is a more rigid structure that can be handled easier during different steps of the manufacturing process. In addition, encapsulation material 221 can cover the sidewalls of both active semiconductor die 201 and interposer 709, protecting die 201 and interposer 709 from environmental conditions (such as heat, moisture, salt, etc.) and manufacturing processes that can cause stress and damages.

Figure 8A:
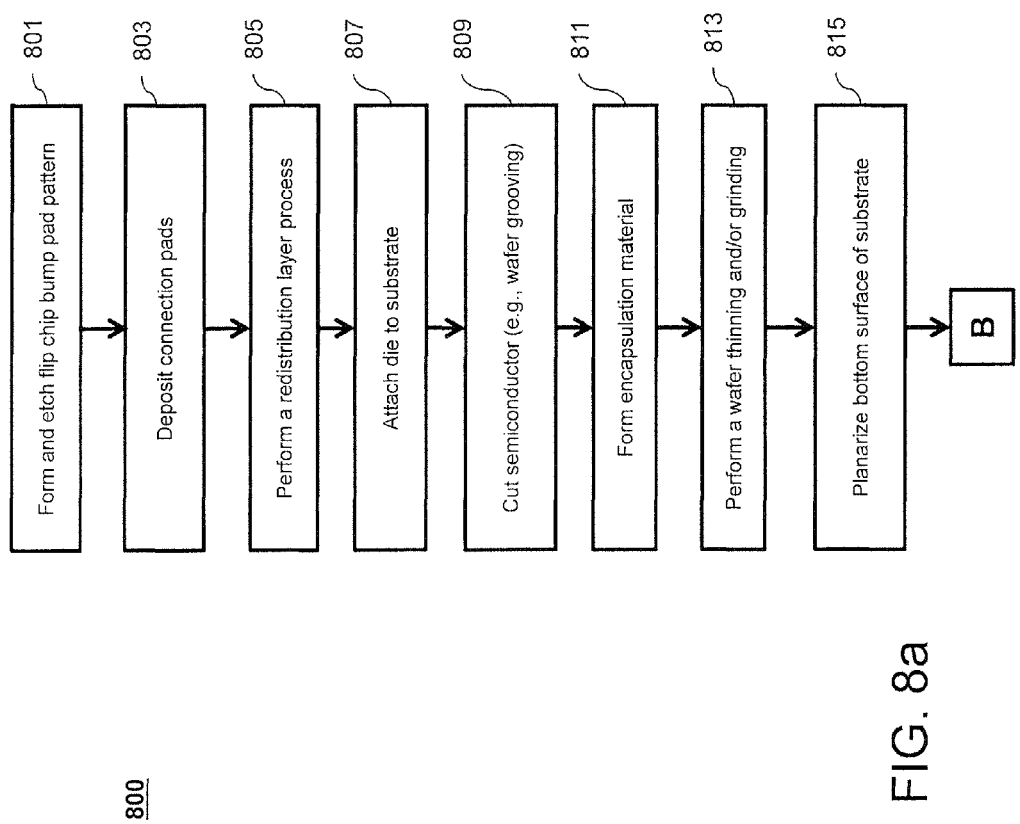
FIGS. 8a-8b are flowcharts illustrating a manufacturing process, in accordance with another embodiment of the present disclosure.
Figure 8B:
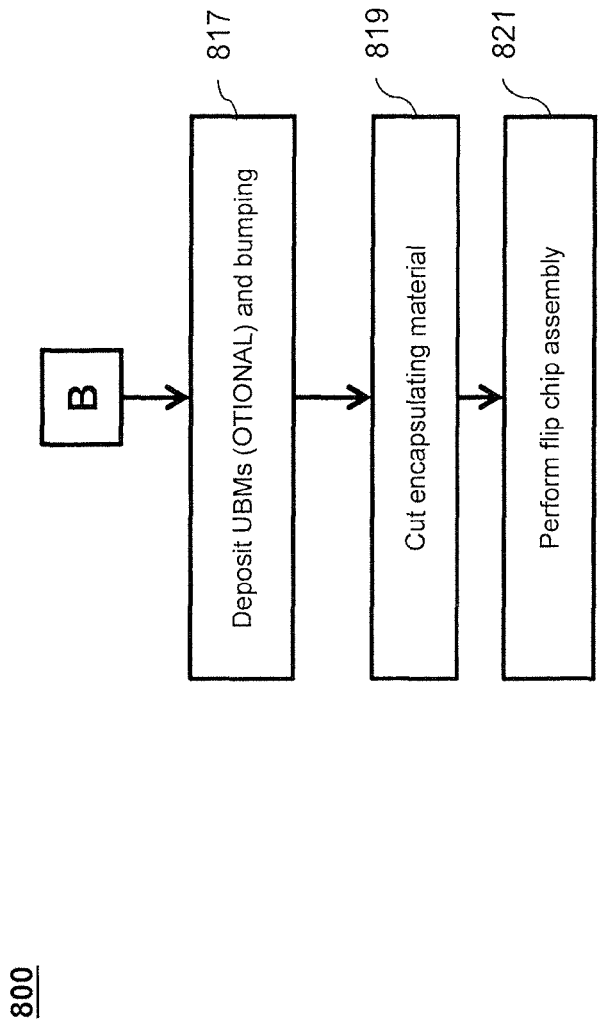

FIGS. 8a-8b and 9a-9l illustrate a manufacturing process for manufacturing circuit assemblies such as one or more of semiconductor packages 200, 250, 300, 400, 440, 500, 530, and 540, in accordance with another embodiment of the present disclosure. The steps in the flowcharts of FIG. 8a-8b are illustrated in FIGS. 9a-9l. It is to be appreciated not all steps may be needed to perform disclosure provided herein. Further, some of the steps may be performed simultaneously, or in a different order than that shown in FIGS. 8a-8b and 9a-9l, as will be understood by those skilled in the art.

In step 801, as shown in FIG. 9b, flip chip bump pad pattern 707 is formed and etched in, for example, substrate 701. Semiconductor substrate 701 may be any semiconductor substrate such as silicon, germanium, gallium, compounds of gallium, etc. Forming and etching pattern 707 can include any etching process known in the art. For example, a mask having a pattern similar to pattern 707 can be put on top of substrate 701 and trenches are etched through substrate 701. The relative depth of the etched trenches can be very small.

In step 803, as shown in FIG. 9c, the etched trenches of pattern 707 are filled with metal fill to form connection pads 219. In one example, step 803 can include depositing metal on substrate 701 and inside trenches of pattern 707 and then planarization of the surface of substrate 701 so that the residue metal is removed from non-patterned surface. Pads 219 may be formed from a metal, metal alloy, multi-metal or multi-alloy stack, such as a multi-alloy stack including a combination of copper (Cu), nickel (Ni), titanium (Ti), tungsten (W), vanadium (V), chromium (Cr), and gold (Au), for example. Pads 219 may be formed using an electrochemical deposition processes, for example, or any other suitable technique, as known in the art.

As discussed before, pads 219 can include connection pads, C4 pads, flip chip bumps, UBMs, etc. In one example, diameter (or length) 741 of pads 219 can be around 65 μm-100 μm. However, diameter (or length) 741 of pads 219 can be smaller such as, but not limited to, around 25 μm or around 1 μm-2 μm. Also, it is noted that forming pattern 707 and filling them with metal fill to form connection pads 219 does not require lining inside of pattern 707 with, for example, isolation material as done in preparing vias in TSV (as discussed above with respect to, for example, FIG. 1b.) In one implementation, the pitch between connection pads 219 can depend on the package substrate requirements and/or the diameter (or length) 741 of pads 219. In one example, the pitch can be as small as twice the diameter (or length) 741 of pads 219.

In step 805, as shown in FIG. 9d, a redistribution layer (RDL) process is performed to from a redistribution layer such as interposer dielectric layer 205 that includes routing traces 213. In one example, routing traces 213 are configured to connect a top of surface of the redistribution layer such as interposer dielectric layer 205 to a bottom surface of the redistribution layer such as interposer dielectric layer 205. Additionally or alternative, routing trace 213 are configured to electrically couple two or more active dies located over the redistribution layer such as interposer dielectric layer 205. The RDL process can include known processes in the art to form multiple layers of dielectric material interleaved with one or more metal layers. In one example, there are vias between adjacent metal layers, which are different than vias in silicon such as the TSV in TSI.

In step 807, as shown in FIG. 9e, active semiconductor IC die 201 with micro-bumps 211 is attached to dielectric interposer 205. Bumps 211 can be micro-bumps, solder bumps, copper pillar, a combination thereof, or any structure suitable for connecting active IC die 201 to dielectric interposer 205. Bumps 211 may be formed from a metal, metal alloy, multi-metal or multi-alloy stack, such as a multi-alloy stack including a combination of copper (Cu), nickel (Ni), tin (Sn), silver (Ag), titanium (Ti), tungsten (W), vanadium (V), chromium (Cr), and gold (Au), for example. Bumps 211 may be formed using an electrochemical deposition processes, for example, or any other suitable technique, as known in the art.

In step 809, as shown in FIG. 9f, substrate 701 is vertically cut and/or grooved to form trenches 717 at both sides of active IC die 201. This cutting process can be a laser cut and/or a mechanical cut. Trenches 717 can have any depth depending on the process. In one implementation, trenches 717 are shallow trenches. In one example, trenches 717 can go in substrate 701 as deep as (or as similar depth as) connection pads 219. Alternatively, trenches 717 can be shallower or deeper than connection pads 219.

In step 811, as shown in FIG. 9g, encapsulation material 221 is formed and is planarized. In one example, encapsulation material 221 is formed over and around active IC die 201, inside trenches 717, over dielectric interposer 205, and between active IC die 201 and dielectric interposer 205. Next, a planarization process can be performed such that the back side of active die 201 (the side further away from dielectric interposer 205) is exposed. In other words, the surface of encapsulation material 221 further away from dielectric interposer 205 would be in the same plane as the back side of active die 201. In one example, encapsulation material can include molding material such as, but not limited to, thermoset epoxy.

In step 813, as shown in FIG. 9h, a wafer thinning and/or grinding process is performed to decrease the thickness of substrate 701. FIG. 9h illustrates that the thinning and/or grinding process is performed until encapsulating material in trenches 717 is revealed on surface 931. However, depending on the depth of connection pads 219 and trenches 717 in substrate 701, the thinning and/or grinding process can be performed until connection pads 219, trenches 717, or both are revealed.

In step 815, as shown in FIG. 9i, the bottom surface 933 of substrate 701 is planarized such that connection pads 219 and encapsulation material in trenches 717 are revealed. In one example, the planarization can include planarization of connection pads 219 so that they are exposed and/or encapsulation material in trenches 717, depending on their depths in substrate 701. What is left from substrate 701, which includes connection pads 219, is also called silicon pad layer herein, such as silicon pad layer 207 of FIG. 2a according to one embodiment.

In step 817, as shown in FIG. 9j, bumps 209 are deposited on connection pads 219. In one example, this step can include depositing under bump metallization (UBMs) on connection pads 219 as an optional step such that bumps 209 can be deposited on UBMs. In one example, bumps 209 can be copper pillars, solder bumps, or other connection means for connecting active IC die 201 to package substrate. UBMs and/or bumps may be formed from a metal, metal alloy, multi-metal or multi-alloy stack, such as a multi-alloy stack including a combination of copper (Cu), nickel (Ni), tin (Sn), silver (Ag), titanium (Ti), tungsten (W), vanadium (V), chromium (Cr), and gold (Au), for example. UBMs and/or bumping may be formed using an electrochemical deposition processes, for example, or any other suitable technique, as known in the art.

In step 819, as shown in FIG. 9k, encapsulating material 221 is cut through trenches 717 to form the flip chip die 937 so that encapsulating material 221 covers around active IC die 201, the sidewalls 204 of active IC die 201, top of interposer 909 (which includes dielectric interposer 205 and substrate 701), and the sidewalls 206 of interposer 909. In one example, a sawing process is performed to cut the encapsulating material 221 (and any part of substrate 701 left). In one implementation, multiple semiconductor packages are prepared neighboring each other using the processes of FIGS. 8a-8b and 9a-9l and in step 819 all the multiple semiconductor packages are separated using the sawing process.

In step 821, as shown in FIG. 9l, flip chip die 937 is attached to a semiconductor substrate (e.g., package substrate) 713 using an underfill material 711. In one example, underfill material 711 is formed (e.g., dispensed) during the assembly underneath the flip chip die 937 around bumps 209 to protect bumps 209. In one example, the underfill material 711 can be epoxy material. However, in one embodiment, underfill material 711 can be different from and/or has different properties than encapsulating material 221, such as a different formula. Solder balls 715 are also formed on package substrate 713.

Although only one active IC die 201 is shown in the processes of FIGS. 8a-8b and 9a-9l, these processes can be performed for any number of IC dies.

As discussed above with respect to the processes of FIGS. 8a-8b and 9a-9l, encapsulating material 221 is formed to cover at least parts of active IC die 201, dielectric interposer 205, and substrate 701 before: the rest of substrate 701 is thinned and/or grinded (FIG. 9h), planarization of FIG. 9i is performed, the encapsulating material is sawed (FIG. 9k), and other processes for assembling the flip chip IC die. This ordering of processing steps makes it easier to handle the semiconductor package during the manufacturing process and also during assembly, because the semiconductor package without the encapsulating material can be a fragile structure. The semiconductor package with the encapsulating material is a more rigid structure that can be handled easier during the different parts of the manufacturing process. In addition, encapsulation material 221 can cover the sidewalls of both active semiconductor IC die 201 and interposer 909, protecting die 201 and interposer 909 from environmental conditions (such as heat, moisture, salt, etc.) and manufacturing processes that can cause stress and damages.

Figure 10A:
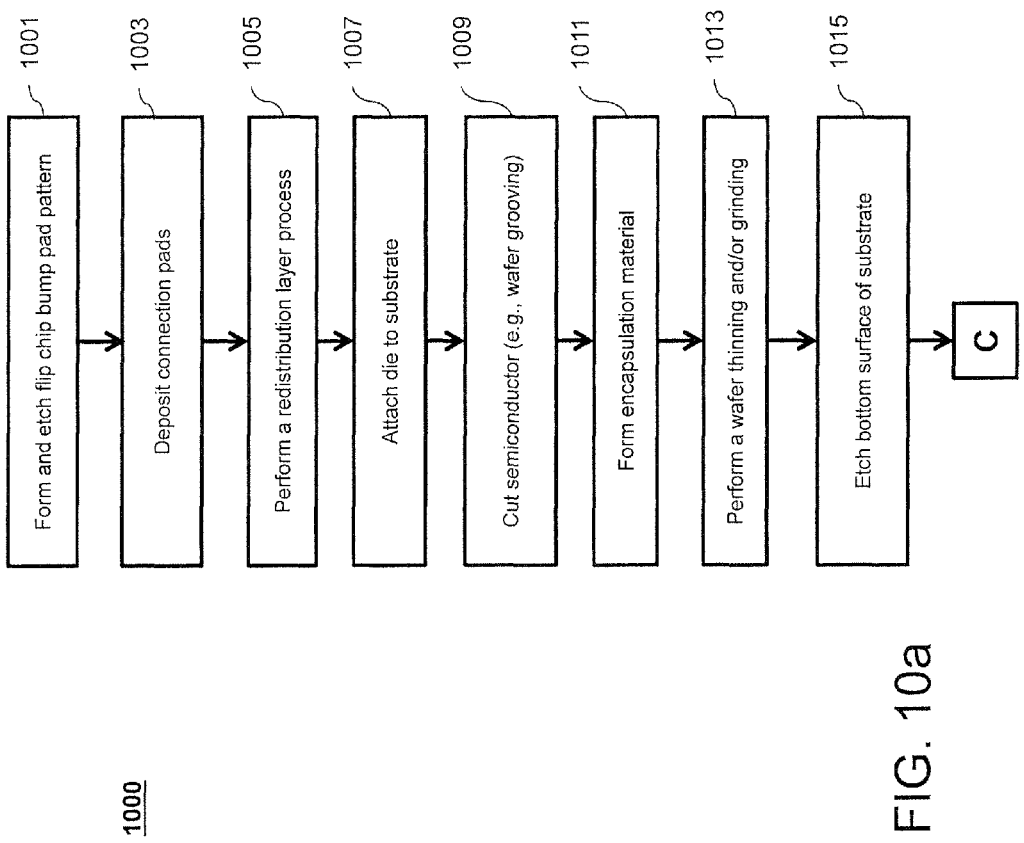
FIGS. 10a-10b are flowcharts illustrating a manufacturing process, in accordance with another embodiment of the present disclosure.
Figure 10B:
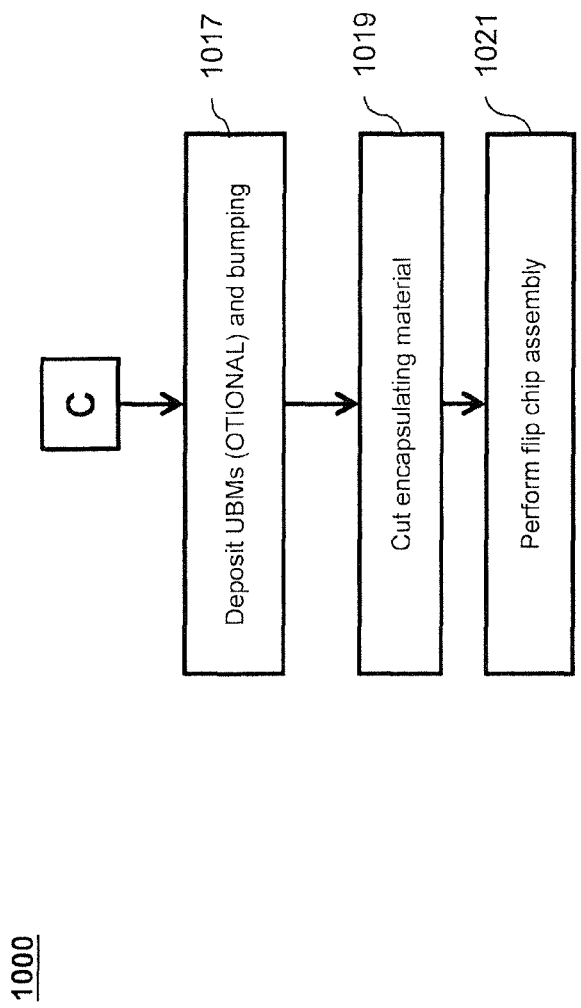

FIGS. 10a-10b and 11a-11l illustrate a manufacturing process for manufacturing circuit assemblies such as one or more of semiconductor packages 200, 250, 300, 400, 440, 500, 530, and 540, in accordance with another embodiment of the present disclosure. The steps in the flowcharts of FIG. 10a-10b are illustrated in FIGS. 11a-11l. It is to be appreciated not all steps may be needed to perform disclosure provided herein. Further, some of the steps may be performed simultaneously, or in a different order than that shown in FIGS. 10a-10b and 11a-11l, as will be understood by those skilled in the art.

Processes performed in steps 1001-1013 and 1017-1021, as shown in FIGS. 11b-11h and 11j-11l, are very similar to processes performed in steps 801-811 and 817-821, as shown in FIGS. 9b-9g and 8j-8l. Therefore, for brevity purposes, not all of these processes are discusses with respect to FIGS. 10 and 11, since they were discussed earlier.

Figure 11A:
Figure 11B:
Figure 11C:
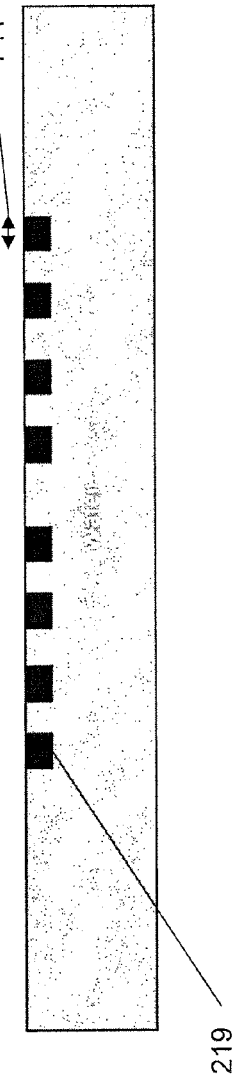
Figure 11G:
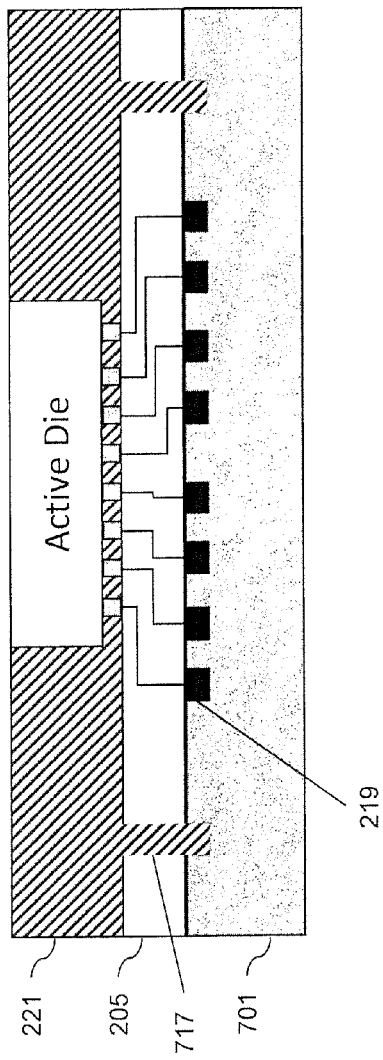
Figure 11H:
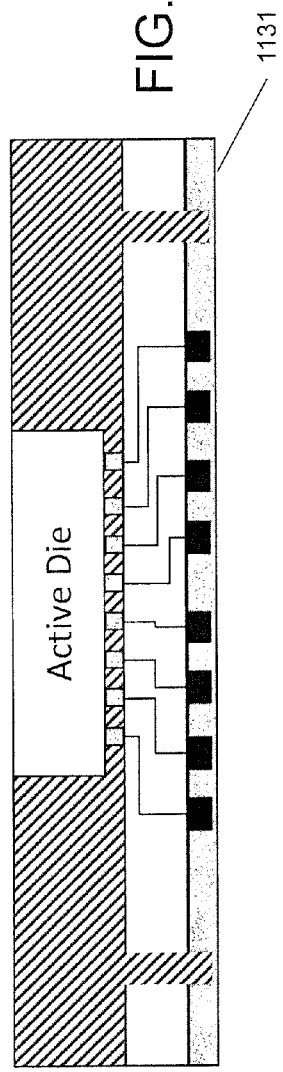

In step 1013, as shown in FIG. 11h, a wafer thinning and/or grinding process is performed to decrease the thickness of substrate 701 from that in FIG. 11g. FIG. 11h illustrates that the thinning and/or grinding process is terminated before either encapsulating material in trenches 717 or connection pads 219 are revealed on surface 1131. However, depending on the depth of connection pads 219 and trenches 717 in substrate 701, the thinning and/or grinding process can be performed until connection pads 219, trenches 717, or both are revealed.

Figure 11I:
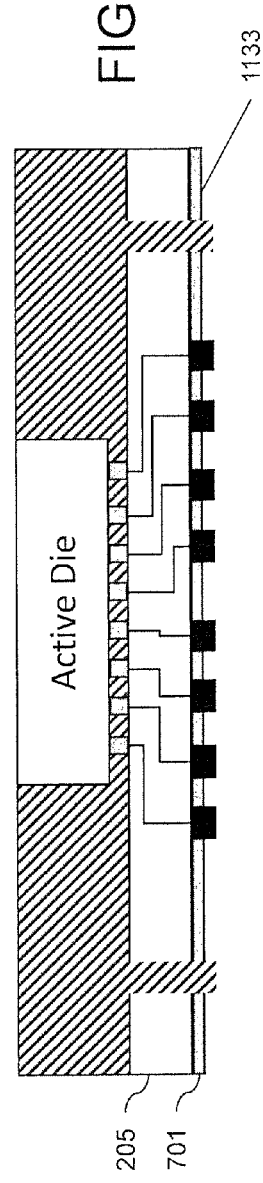

In step 1115, as shown in FIG. 11i, the bottom surface 1133 of substrate 701 is etched such that connection pads 219 and encapsulation material in trenches 717 are revealed. In one example, the etching process in step 1115 can also include a planarization of connection pads 219 and/or encapsulation material in trenches 717, depending on their depths in substrate 701. As shown in FIG. 11i, substrate 701 is etched such that connection pads 219 and encapsulation material in trenches 717 are extended below the surface 1133. What is left from substrate 701, which includes connection pads 219, can also be called silicon pad layer herein, such as silicon pad layer 307 of FIG. 3 according to one embodiment. Alternatively, etching process of step 1115 can continue such that all the substrate 701 is etched and no substrate 701 remains. In this case, surface 1133 would be the bottom surface of dielectric interposer 205.

In step 1017, as shown in FIG. 11j, bumps 209 are deposited on connection pads 219. In one example, this step can include depositing under bump metallization (UBMs) on connection pads 219 as an optional step such that bumps 209 can be deposited on UBMs. In one example, bumps 209 can be copper pillars, solder bumps, or other connection means for connecting active die 201 to package substrate.

In step 1019, as shown in FIG. 11k, encapsulating material 221 is cut through trenches 717 to form the flip chip die 1137, such that encapsulating material 221 covers around active IC die 201, the sidewalls 204 of active IC die 201, top of interposer 1109 (which includes dielectric interposer 205 and substrate 701), and the sidewalls of interposer 1109. As shown in FIG. 11k, encapsulating material 221 has encapsulation skirts (such as encapsulation skirts 325 of FIG. 3) that extend below substrate 701 on either side of substrate 701. In one example, a sawing process is performed to cut the encapsulating material 221 (and any part of substrate 701 left.) In one implementation, multiple semiconductor packages are prepared neighboring each other using the processes of FIGS. 10a-10b and 11a-11l and in step 1019 all the multiple semiconductor packages are separated using the sawing process.

In step 1021, as shown in FIG. 11*l*, flip chip die 1137 is attached to semiconductor substrate (e.g., package substrate) 713. In one example, underfill material 711 is formed (e.g., deposited) during the assembly underneath the flip chip die 1137 around bumps 209 to protect bumps 209 to form the attachment. In one example, underfill material 711 can be epoxy material. However, underfill material 711 can be different from and/or has different properties than encapsulating material 221, such as a different formula. Solder balls 715 are also formed on package substrate 713.

Although only one active IC die 201 is shown in the processes of FIGS. 10*a*-10*b* and 11*a*-11*l*, these processes can be performed for any number of dies.

As discussed above with respect to the processes of FIGS. 10*a*-10*b* and 11*a*-11*l*, encapsulating material 221 is formed to cover at least parts of active IC die 201, dielectric interposer 205, and substrate 701 before: the rest of substrate 701 is thinned and/or grinded (FIG. 11*h*), etching of FIG. 11*i* is performed, the encapsulating material is sawed (FIG. 11*k*), and other processes for assembling the flip chip die are performed. This makes handling semiconductor package easier during the manufacturing process and also during assembly, because the semiconductor package without the encapsulating material can be a fragile structure. The semiconductor package with the encapsulating material is a more rigid structure that can be handled easier during different parts of the manufacturing process without incurring damage. In addition, encapsulation material 221 can cover the sidewalls of both active semiconductor IC die 201 and interposer 1109, protecting IC die 201 and interposer 1109 from environmental conditions (such as heat, moisture, salt, etc.) and manufacturing processes that can cause stress and damage.

Figure 12A:
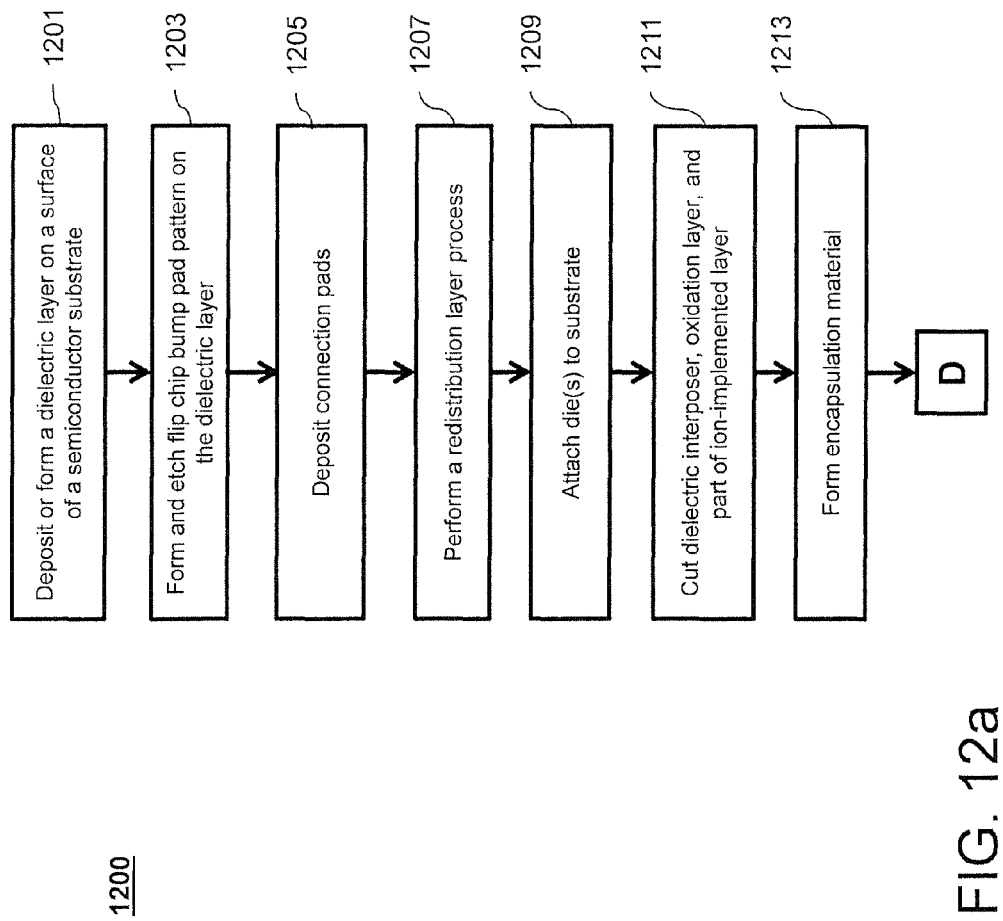
FIGS. 12a-12b are flowcharts illustrating a manufacturing process, in accordance with another embodiment of the present disclosure.
Figure 12B:
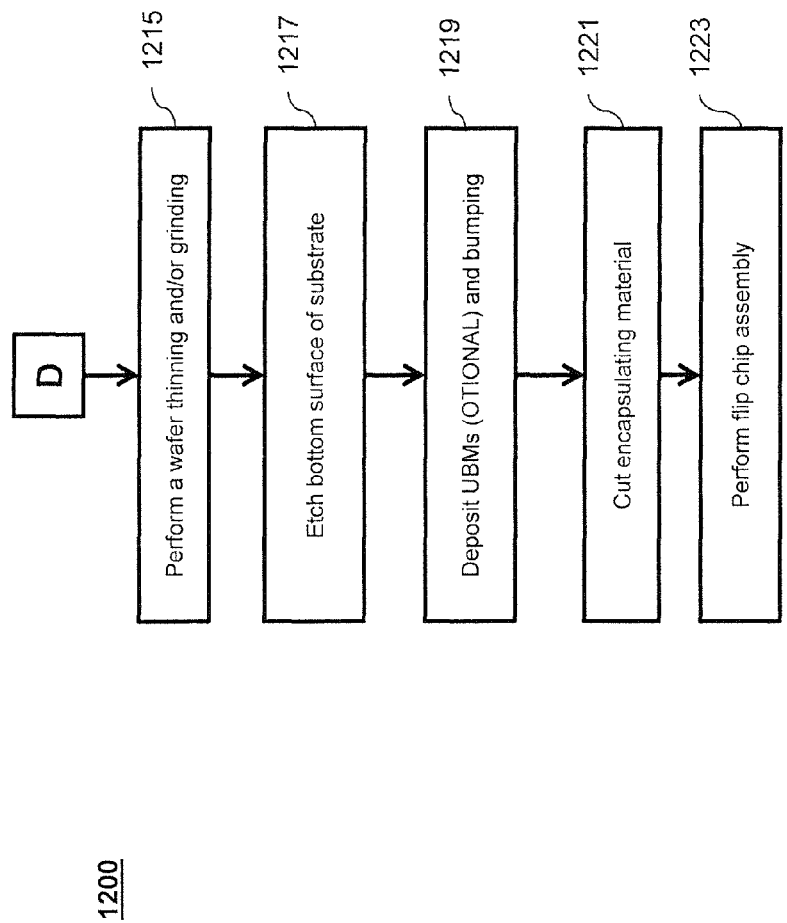

FIGS. 12*a*-12*b* and 13*a*-13*m* illustrate a manufacturing process for manufacturing circuit assemblies such as one or more of semiconductor packages 200, 250, 300, 400, 440, 500, 530, and 540, in accordance with another embodiment of the present disclosure. The steps in the flowcharts of FIG. 12*a*-12*b* are illustrated in FIGS. 13*a*-13*m*. It is to be appreciated not all steps may be needed to perform disclosure provided herein. Further, some of the steps may be performed simultaneously, or in a different order than that shown in FIGS. 12*a*-12*b* and 13*a*-13*m*, as will be understood by those skilled in the art.

Figure 13A:
Figure 13B:

In step 1201, as shown in FIG. 13*b*, a dielectric layer 1301 is deposited and/or formed on a surface of substrate 701. Semiconductor substrate 701 may be any semiconductor substrate such as silicon, germanium, gallium, compounds of gallium, etc. In one example, dielectric layer 1301 can be formed of a flexible dielectric formed of a polyimde, silicon nitride, silicon oxide, a polyimide film or other suitable tape material. Alternatively, dielectric layer 1301 can be formed of a rigid dielectric material, such as fiber reinforced bismaleimide triazine (BT), FR-4, glass, or ceramic, for example. In some implementations, dielectric layer 1301 may be formed of an epoxy-phenolic or cyanate ester-epoxy build-up material. As a specific example, in one implementation, dielectric layer 1301 may be formed of an Ajinomoto™ Build-up Film (ABF). In other implementations, dielectric layer 1301 may be an oxide or nitride layer, such as a silicon nitride (Si3N4) layer, for example, formed using a chemical vapor deposition process (CVD), or any other suitable process for producing dielectric layer 1301.

Figure 13C:
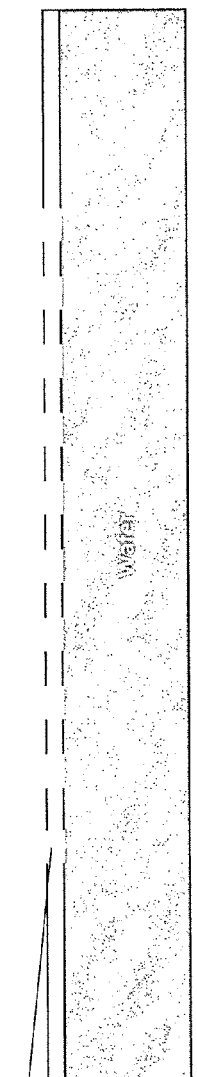

In step 1203, as shown in FIG. 13*c*, flip chip bump pad pattern 707 is formed and etched in, for example, dielectric layer 1301. Forming and etching pattern 707 can include any etching process known in the art. For example, a mask having a pattern similar to pattern 707 can be put on top of dielectric layer 1301 and trenches are etched through dielectric layer 1301. The depth of the etched trenches is very small. In one embodiment, the trenches of pattern 707 are only made in dielectric layer 1301 and not in substrate 701. In other words, the trenches of pattern 707 stop at the top surface of substrate 701 on which dielectric layer 1301 is formed.

Figure 13D:
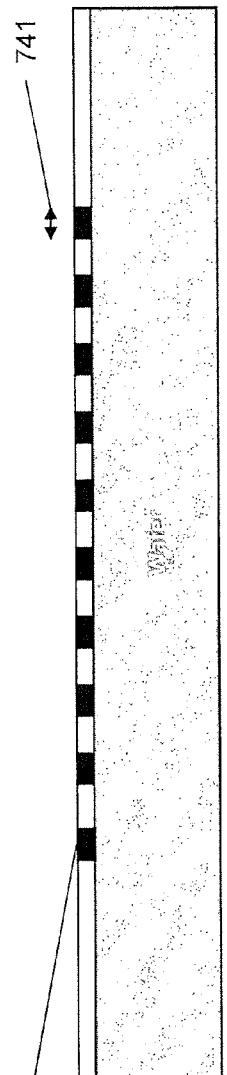

In step 1205, as shown in FIG. 13*d*, the etched trenches of pattern 707 are filled with metal fill to form connection pads 219. In one example, step 1205 can include depositing metal on dielectric layer 1301 and inside trenches of pattern 707 and then planarization of the surface of dielectric layer 1301 so that the residue metal is removed from the non-patterned portion of the surface. Pads 219 may be formed from a metal, metal alloy, multi-metal or multi-alloy stack, such as a multi-alloy stack including a combination of copper (Cu), nickel (Ni), titanium (Ti), tungsten (W), vanadium (V), chromium (Cr), and gold (Au), for example. Pads 219 may be formed using an electrochemical deposition processes, for example, or any other suitable technique, as known in the art.

As discussed before, pads 219 can include connection pads, C4 pads, flip chip bumps, UBMs, etc. In one example, diameter (or length) 741 of pads 219 can be around 65 μm-100 μm. However, diameter (or length) 741 of pads 219 can be smaller such as, but not limited to, around 25 μm or around 1-2 μm. Also, it is noted that forming pattern 707 and filling them with metal fill to form connection pads 219 does not require lining inside of pattern 707 with, for example, isolation material as done in preparing vias in TSV (as discussed above with respect to, for example, FIG. 1*b*.) In one implementation, the pitch between connection pads 219 can depend on the package substrate requirements and/or the diameter (or length) 741 of pads 219. In one example, the pitch can be as small as twice the diameter (or length) 741 of pads 219.

Figure 13E:
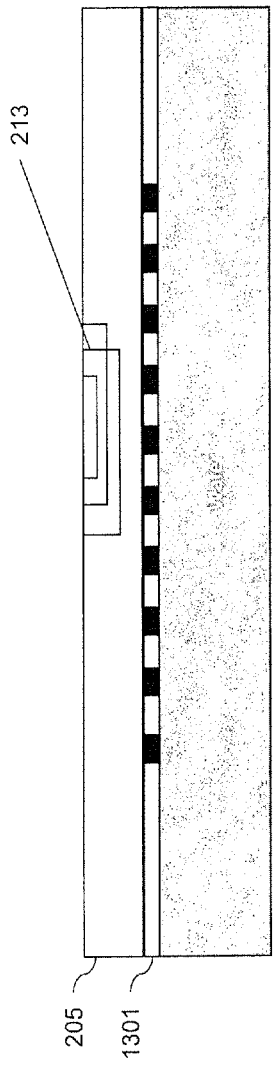

In step 1207, as shown in FIG. 13*e*, a redistribution layer (RDL) process is performed to form a redistribution layer such as interposer dielectric layer 205 that includes routing traces 213 over dielectric layer 1301. In one example, routing traces 213 are configured to connect a top of surface of the redistribution layer such as interposer dielectric layer 205 to a bottom surface of the redistribution layer such as interposer dielectric layer 205. Additionally or alternative, routing trace 213 are configured to electrically couple two or more active dies located over the redistribution layer such as interposer dielectric layer 205. The RDL process can include known processes in the art to form, for example, layers of dielectric material interleaved with one or more metal layers. The metal layers can be stacked within dielectric layers and on each other and/or on dielectric layers form the routing traces 213. In one example, there are vias between adjacent metal layers. These vias are different from the through silicon via of TSI. As illustrated in FIGS. 13*e*-13*m*, the exemplary processes of FIG. 13 illustrates forming two active IC dies on interposer dielectric layer 205. In exemplary FIG. 13*e*, only routing traces are shown that electrically couple the two active IC dies. Although not shown, interposer dielectric layer 205 can include routing traces for electrically coupling the individual active dies to connection pads 219.

Figure 13F:
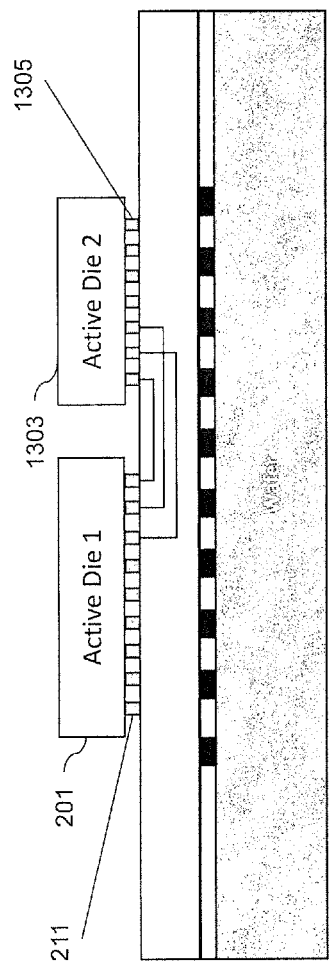

In step 1209, as shown in FIG. 13*f*, active semiconductor IC die 201 with micro-bumps 211 and active semiconductor IC die 1303 with micro-bumps 1305 are attached to dielectric interposer 205. Bumps 211 and 1305 can be micro-bumps, solder bumps, copper pillar, a combination thereof, or any structure suitable for connecting active die 201 to dielectric interposer 205. Bumps 211 and 1305 may be formed from a metal, metal alloy, multi-metal or multi-alloy stack, such as a multi-alloy stack including a combination of copper (Cu), nickel (Ni), tin (Sn), silver (Ag), titanium (Ti), tungsten (W), vanadium (V), chromium (Cr), and gold (Au), for example. Bumps 211 and 1305 may be formed using an electrochemical deposition processes, for example, or any other suitable technique, as known in the art.

Figure 13G:
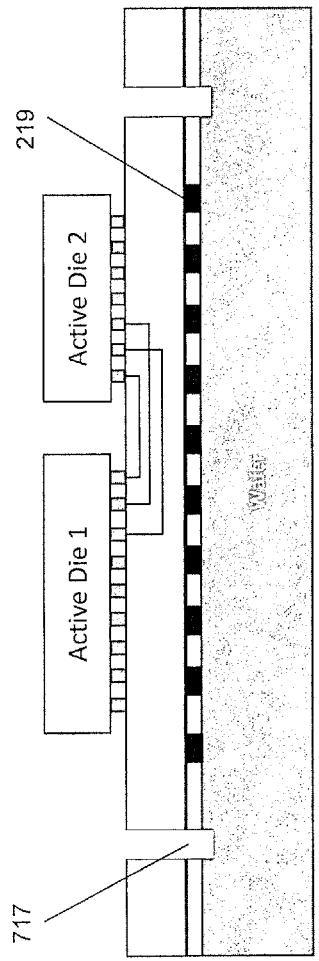

In step 1211, as shown in FIG. 13g, dielectric interposer 205, dielectric layer 1301, and substrate 701 are vertically cut and/or grooved to form trenches 717 on respective sides of active IC dies 201 and 1303. This cutting process can be a laser cut and/or a mechanical cut. Trenches 717 can have any depth depending on the process. In one implementation, trenches 717 are shallow trenches. In one example, trenches 717 can go in substrate 701 as deep as (or as similar depth as) connection pads 219. Alternatively, trenches 717 can be shallower or deeper than connection pads 219. The exemplary embodiment of FIG. 13g illustrates that trenches 717 extend into wafer 701 although connection pads 219 do not extend into wafer 701.

In step 1213, as shown in FIG. 13h, encapsulation material 221 is formed and is planarized. In one example, encapsulation material 221 is formed over and around and between active IC dies 201 and 1303, inside trenches 717, over dielectric interposer 205, and between active CI dies 201 and 1301 and dielectric interposer 205. Next, a planarization process can be performed such that the back side of active dies 201 and 1303 (the side further away from dielectric interposer 205) is exposed. In other words, the surface of encapsulation material 221 further away from dielectric interposer 205 is planarized to be the same plane as the back side of active IC dies 201 and 1303. In one example, encapsulation material can include molding material such as thermoset epoxy.

In step 1215, as shown in FIG. 13i, a wafer thinning and/or grinding process is performed to decrease the thickness of substrate 701. FIG. 13i illustrates that the thinning and/or grinding process is performed until encapsulating material in trenches 717 is revealed on surface 1331. In this implementation, connection pads 219 do not extend in substrate 701 but encapsulation material in trenches 717 has extended in wafer 701. However, depending on the depth of connection pads 219 and trenches 717 in substrate 701, the thinning and/or grinding process can be performed until connection pads 219, trenches 717, or both are revealed.

In step 1217, as shown in FIG. 13j, substrate 701 is etched such that connection pads 219 and encapsulation material in trenches 717 are revealed, and therefore accessible for connection. In one example, the etching process in step 1217 can also include a planarization of connection pads 219 and/or encapsulation material in trenches 717, depending on their depths in substrate 701. As shown in FIG. 13j, all of substrate 701 is etched and no substrate 701 remains. In this example, connection pads 219 are revealed and are planar with surface 1333 of dielectric layer 1301 and encapsulation material in trenches 717 are extended below the surface 1333. In this case, no substrate exists below dielectric layer 1301.

In step 1219, as shown in FIG. 13k, bumps 209 are deposited on connection pads 219. In one example, this step can include depositing under bump metallization (UBMs) on connection pads 219 as an optional step such that bumps 209 can be deposited on UBMs. In one example, bumps 209 can be copper pillars, solder bumps, or other connection means for connecting active die 201 to package substrate. UBMs and/or bumps may be formed from a metal, metal alloy, multi-metal or multi-alloy stack, such as a multi-alloy stack including a combination of copper (Cu), nickel (Ni), tin (Sn), silver (Ag), titanium (Ti), tungsten (W), vanadium (V), chromium (Cr), and gold (Au), for example. UBMs and/or bumps may be formed using an electrochemical deposition processes, for example, or any other suitable technique, as known in the art.

In step 1221, as shown in FIG. 13l, encapsulating material 221 is cut through trenches 717 (to from the flip chip die 1337) such that encapsulating material 221 covers around active IC dies 201 and 1303, the sidewalls 404 of active IC dies 201 and 1303, top of interposer 1309 (which includes dielectric interposer 205 and dielectric layer 1301), and the sidewalls 406 of interposer 1309. In one example, a sawing process is performed to cut the encapsulating material 221. In one implementation, multiple semiconductor packages are prepared neighboring each other using the processes of FIGS. 12a-12b and 13a-13m and in step 1221 all the multiple semiconductor packages are separated using the sawing or cutting process, e.g. laser.

In step 1223, as shown in FIG. 13m, flip chip die 1337 is attached to semiconductor substrate (e.g., package substrate) 713. In one example, underfill material 711 are formed during the assembly underneath the flip chip die 1337 around bumps 209 to protect bumps 209 to complete the attachment. In one example, underfill material 711 can be epoxy material. However, underfill material 711 can be different from and/or has different properties than encapsulating material 221, such as a different formula. Solder balls 715 are also formed on package substrate 713.

Although only two active IC dies are shown in the processes of FIGS. 12a-12b and 13a-13m, these processes can be performed for any number of dies.

As discussed above with respect to the processes of FIGS. 12a-12b and 13a-13m, encapsulating material 221 is formed to cover at least parts of active IC dies 201 and 1303, dielectric interposer 205, and dielectric layer 1301 before: the rest of substrate 701 is thinned and/or grinded (FIG. 13i), etching of FIG. 13j is performed, the encapsulating material is sawed (FIG. 13l), and other processes for assembling the flip chip die is performed. This will make handling the semiconductor package easier during the manufacturing process and also during assembly, because the semiconductor package without the encapsulating material can be a fragile structure. However, the semiconductor package with the encapsulating material is a more rigid structure that can be handled easier during different parts of the manufacturing process. In addition, encapsulation material 221 can cover the sidewalls of both active semiconductor IC die 201 and interposer 1309, protecting die 201 and interposer 1309 from environmental conditions (such as heat, moisture, salt, etc.) and manufacturing processes that can cause stress and damages.

The exemplary embodiments described herein are provided for illustrative purposes, and are not limiting. Other exemplary embodiments are possible, and modifications may be made to the exemplary embodiments within the spirit and scope of the disclosure. For example, one or more of the exemplary embodiments discussed above and/or one or more features of one or more of the exemplary embodiments discussed above can be combined.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments. Further, the claims should be defined only in accordance with their recitations and their equivalents.

What is claimed is:

1. A circuit assembly, comprising:
a silicon pad layer including a plurality of metal pads, each metal pad configured to receive a corresponding bump of a plurality of bumps;
an oxide layer disposed directly on, and in contact with, the silicon pad layer;
an interposer dielectric layer disposed on the oxide layer, the interposer dielectric layer including a plurality of routing traces that connect a top surface of the interposer dielectric layer to a bottom surface of the interposer dielectric layer;
an integrated circuit (IC) die attached to the plurality of routing traces at the top surface of the interposer dielectric layer using a plurality of IC bumps; and
an encapsulating material encapsulating at least a portion of the silicon pad layer, the oxide layer, the interposer dielectric layer, and the IC die to provide structural support for the circuit assembly.

2. The circuit assembly of claim 1, wherein the silicon pad layer, the oxide layer, and the interposer dielectric layer form an interposer, and wherein the encapsulating material covers sidewalls of the interposer.

3. The circuit assembly of claim 2, wherein the encapsulating material extends below the interposer so that the interposer is recessed in the encapsulating material to form an encapsulating material skirt.

4. The circuit assembly of claim 1, wherein the IC die is completely encased in the encapsulating material.

5. The circuit assembly of claim 1, further comprising an underfill layer deposited between a bottom surface of the IC die and the top surface of the interposer dielectric layer, wherein the underfill layer encapsulates the plurality of IC bumps.

6. The circuit assembly of claim 1, further comprising a package substrate attached to the silicon pad layer by the plurality of bumps at a top surface of the package substrate.

7. The circuit assembly of claim 1, further comprising a second IC die attached to the top surface of the interposer dielectric layer and electrically coupled with the IC die through a second plurality of routing traces disposed in the interposer dielectric layer.

8. A circuit assembly, comprising:
a silicon pad layer including a plurality of metal pads, each metal pad configured to receive a corresponding bump of a plurality of bumps;
an oxide layer disposed on the silicon pad layer;
an interposer dielectric layer disposed on the oxide layer, the interposer dielectric layer including a plurality of routing traces that connect a top surface of the interposer dielectric layer to a bottom surface of the interposer dielectric layer;
an integrated circuit (IC) die attached to the plurality of routing traces at the top surface of the interposer dielectric layer using a plurality of IC bumps;
an encapsulating material encapsulating at least a portion of the silicon pad layer, the oxide layer, the interposer dielectric layer, and the IC die to provide structural support for the circuit assembly, wherein at least one surface of the IC die is exposed through the encapsulating material; and
a heat spreader attached to the at least one surface of the IC die exposed through the encapsulating material.

9. A circuit assembly, comprising:
a dielectric layer including a plurality of metal pads, each metal pad configured to receive a corresponding bump of a plurality of bumps;
an interposer dielectric layer disposed on the dielectric layer, the interposer dielectric layer including a plurality of routing traces that connect a top surface of the interposer dielectric layer to a bottom surface of the interposer dielectric layer;
an integrated circuit (IC) die attached to the plurality of routing traces at the top surface of the interposer dielectric layer using a plurality of IC bumps; and
an encapsulating material encapsulating at least a portion of the dielectric layer, the interposer dielectric layer, and the IC die to provide structural support for the circuit assembly,
wherein the interposer dielectric layer and the dielectric layer are formed from the same material.

10. The circuit assembly of claim 8, further comprising an underfill layer deposited between a bottom surface of the IC die and the top surface of the interposer dielectric layer, wherein the underfill layer encapsulates the plurality of IC bumps.

11. The circuit assembly of claim 8, further comprising a package substrate attached to the silicon pad layer by the plurality of bumps at a top surface of the package substrate.

12. The circuit assembly of claim 8, further comprising a second IC die attached to the top surface of the interposer dielectric layer and electrically coupled with the IC die through a second plurality of routing traces disposed in the interposer dielectric layer.

13. A circuit assembly, comprising:
a silicon pad layer including a plurality of metal pads, each metal pad configured to receive a corresponding bump of a plurality of bumps;
an interposer dielectric layer disposed on the silicon pad layer, the interposer dielectric layer including a plurality of routing traces that connect a top surface of the interposer dielectric layer to a bottom surface of the interposer dielectric layer;
an integrated circuit (IC) die attached to the plurality of routing traces at the top surface of the interposer dielectric layer using a plurality of IC bumps;
an encapsulating material encapsulating at least a portion of the silicon pad layer, the interposer dielectric layer, and the IC die to provide structural support for the circuit assembly, wherein at least one surface of the IC die is exposed through the encapsulating material; and
a heat spreader attached to the at least one surface of the IC die exposed through the encapsulating material.

14. The circuit assembly of claim 13, wherein the silicon pad layer and the interposer dielectric layer form an interposer, and wherein the encapsulating material covers sidewalk of the interposer.

15. The circuit assembly of claim 14, wherein the encapsulating material extends below the interposer so that the interposer is recessed in the encapsulating material to form an encapsulating material skirt.

16. The circuit assembly of claim 13, further comprising a second IC die attached to the top surface of the interposer dielectric layer and electrically coupled with the IC die through a second plurality of routing traces disposed in the interposer dielectric layer.

17. The circuit assembly of claim 13, further comprising an underfill' layer deposited between a bottom surface of the silicon pad layer and a top surface of a package substrate, wherein the underfill layer encapsulates the plurality of bumps.

18. The circuit assembly of claim 9, further comprising a second IC die attached to the top surface of the interposer dielectric layer and electrically coupled with the IC die through a second plurality of routing traces disposed in the interposer dielectric layer.

19. The circuit assembly of claim 9, wherein the dielectric layer and the interposer dielectric layer form an interposer, and wherein the encapsulating material covers sidewalls of the interposer.

20. The circuit assembly of claim 19, wherein the encapsulating material extends below the interposer so that the interposer is recessed in the encapsulating material.

* * * * *